(12) United States Patent
Nakanishi et al.

(10) Patent No.: US 6,735,024 B2
(45) Date of Patent: May 11, 2004

(54) OPTICAL PICKUP WITH IMPROVED OPTICAL PROPERTIES

(75) Inventors: Hideyuki Nakanishi, Otsu (JP);
Shoichi Takasuka, Osaka (JP);
Shinichi Ijima, Takatsuki (JP); Akio Yoshikawa, Kyotanabe (JP); Kazutoshi Onozawa, Takatsuki (JP); Kazuhiko Yamanaka, Takatsuki (JP); Naoki Nakanishi, Shiga-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/263,166

(22) Filed: Oct. 2, 2002

(65) Prior Publication Data

US 2003/0112533 A1 Jun. 19, 2003

Related U.S. Application Data

(62) Division of application No. 09/666,518, filed on Sep. 20, 2000, now Pat. No. 6,473,248.

(30) Foreign Application Priority Data

Sep. 21, 1999 (JP) .......................................... 11-266812
Feb. 1, 2000 (JP) .......................................... 2000-23683
Mar. 22, 2000 (JP) .......................................... 2000-79770
Mar. 29, 2000 (JP) .......................................... 2000-92386

(51) Int. Cl.$^7$ .............................. G02B 7/02; G11B 7/00; G11B 17/30
(52) U.S. Cl. ...................... 359/813; 359/814; 359/823; 359/824; 369/44.14; 369/44.15; 369/219

(58) Field of Search ................................ 359/811, 813, 359/814, 823, 824; 369/44.14, 44.15, 44.16, 219, 247

(56) References Cited

U.S. PATENT DOCUMENTS

| 5,018,836 | A | | 5/1991 | Noda et al. | ................. 359/814 |
| 5,241,528 | A | * | 8/1993 | Mohri et al. | ................. 369/219 |
| 5,781,352 | A | | 7/1998 | Ujiie et al. | ................. 359/824 |
| 6,246,531 | B1 | * | 6/2001 | Hori et al. | ................. 359/811 |

FOREIGN PATENT DOCUMENTS

| JP | 2203431 | 8/1990 |
| JP | 668495 | 3/1994 |
| JP | 7105551 | 4/1995 |
| JP | 7114743 | 5/1995 |
| JP | 877585 | 3/1996 |
| JP | 97203 | 1/1997 |
| JP | 954969 | 2/1997 |
| JP | 1166605 | 3/1999 |
| JP | 1196572 | 3/1999 |
| JP | 11134684 | 5/1999 |
| JP | 11185268 | 7/1999 |

* cited by examiner

Primary Examiner—Loha Ben

(57) ABSTRACT

A movable enclosure contains optical components, such as an objective lens, a semiconductor laser, a mirror, and a photodetector. The movable enclosure is supported by a fixed member via a plurality of wires that are positioned in parallel. This construction allows the movable enclosure to move in a tracking direction and a focusing direction. The plurality of wires are insulated from one another to be also used as power-supplying lines and signal lines for the semiconductor laser and the photodetector.

31 Claims, 29 Drawing Sheets

OPTICAL PICKUP WITH IMPROVED OPTICAL PROPERTIES

This is a divisonal application of U.S. Ser. No. 09/666,518, filed on Sep. 20, 2000, now U.S. Pat. No. 6,473,248 B1, for "A METHOD FOR MANUFACTURING AN OPTICAL PICKUP."

BACKGROUND OF THE INVENTION (1) Field of the Invention

The present invention relates to an optical pickup that is used to read and write information from and onto an optical recording medium, and to a method for manufacturing this optical pickup.

(2) Description of the Related Art

In recent years, optical recording media, such as a compact disc (CD) and a digital versatile disc (DVD), are increasingly used to store various types of information, and such recording media are rapidly becoming in widespread use. An optical pickup is usually used as an optic device that performs a read from and a write onto such an optical recoding medium.

FIG. 1 shows a construction of a conventional optical pickup 400 in a vertical section view.

As shown in the figure, the optical pickup 400 has a movable member 406 which is movable and which carries an objective lens 401 and coils 405. A fixed member 407 supports the movable member 406 almost horizontally via four wires 412 which are positioned in parallel to one another. The fixed member 407 is fixed to an optical base 409.

Since this figure is a section view obtained by vertically cutting the optical pickup 400, two out of the four wires 421 are not shown in the figure.

In addition to the fixed member 407, a yoke 410 that supports a magnet 411, an integrated component 402, a collimating lens 420, and a mirror 403 are positioned onto the optical base 409.

The integrated component 402 contains a semiconductor laser and a photodetector. The semiconductor laser emits a laser beam, which is then collimated by the collimating lens 420 to generate a collimated beam. The mirror 403 has an optical path of the collimated beam changed ninety degrees upward to have the beam enter into the objective lens 401, which then focuses the beam onto the recording surface of an optical recording medium 412. The beam is then reflected on the surface of the recording medium 412, and reverses along the above optical path. The photodetector in the integrated component 402 detects this beam, so that a signal recorded on the recording medium 412 can be read by the optical pickup 400. Hereafter, the beam reflected on the recording medium 412 is called "a return beam".

Optical recording media tend to vertically vibrate when rotated. Accordingly, it is necessary to keep positioning the recording surface of the optical recording medium 412 within the depth of field of the laser beam L1 converged by the objective lens 401 by moving the objective lens 401 in a direction of its optical axis. Eccentricities in the rotation of the optical recording medium 412 make it also necessary to reposition the laser beam L1 so that it correctly follows a track on the optical recording medium 412. Accordingly, an optical pickup is required to have an adjusting function and an error detecting function for having the laser beam correctly focused on a recording medium, and for having the laser beam correctly follow a track.

The conventional optical pickup 400 therefore has the photodetector in the integrated component 402 detect a focusing error and a tracking error by receiving the return light, and suitably controls currents supplied to the coils 405. Currents passed through the coils 405 interact with a magnetic filed generated by the magnet 411 fixed to the yoke 410 so that Lorentz forces are generated. As a result, the objective lens 401 moves in a focusing direction (i.e., a direction of the laser beam L1 being projected), and in a tracking direction (i.e., a direction which traverses tacks) that has the laser beam L1 correctly projected onto a track of the recording medium 412. By performing these operations, the optical pickup 400 can accurately perform a write onto and a read from the optical recording medium 412.

With this conventional optical pickup 400 that moves the objective lens 410 in this way, the integrated component 402, the collimating lens 120, and the mirror 403 are all fixed to the optical base 409 although only the objective lens 401 is movable to correct the focusing error and the tracking error. As a result, a displacement is generated between the optical axis of the objective lens 401 and a principal ray of the laser beam emitted by the semiconductor laser, so that a lens aberration is generated. This decreases optical properties of the optical pickup 400, and so precision of the optical pickup 400 for a write onto and a read from the optical recording medium 412 decreases.

One method to solve the above problem is to position the semiconductor laser, the photodetector, and the collimating lens 420 into the movable member 406 that supports the objective lens 401 so as to maintain the constant positional relationship between these optical components all the time and thereby prevent optical displacements from being generated.

FIG. 2 is a simplified diagram showing a construction of an optical pickup 500 achieved according to this method.

As shown in the figure, the optical pickup 500 includes a movable enclosure 505 that carries an objective lens 501, a semiconductor laser 502, a photodetector 503, and a beam splitter 504. (Hereafter, an optical pickup that has a movable enclosure carrying all the optical components of the optical system is called an "optical-component-integrated optical pickup".) The movable enclosure 505 is fixed to a fixed member 506 via four wires 507 in a manner that allows the movable enclosure 505 to move in both the focusing direction and the tracking direction. The bottom portions of the movable enclosure 505 is also combined with a flexible printed circuit 508, which supplies electric power to the semiconductor laser 502 and the photodetector 503, and transfers a signal to/from them.

When the entire optical system is included in the movable enclosure 505 in this way, displacements, due to movements of the objective lens 501, no longer occur between the optical axis of the objective lens 501 and the principal ray of the laser beam. However, the flexible printed circuit 508 exerts an unnecessary force to the movable enclosure 505 which is suspended by the four wires 507. This not only prevents smooth vertical and horizontal movements of the movable enclosure 505, but also produces unnecessary resonance due to the elasticity of the flexible printed circuit 508 when the enclosure 505 moves. This prevents the optical pickup 500 from correctly following a track, and therefore the construction of the above optical-component-integrated optical pickup becomes meaningless. Hereafter, the capability of an optical pickup correctly following a track is called a "trackability" of the optical pickup.

The conventional optical pickup 500 also has the following problems due to its supporting construction with the four wires 507.

The four wires 507 have the same length and the same thickness, and are made of the same material. As a result, each wire 507 has the same elastic coefficient in both the focusing direction and the tracking direction, and ends of these wires 507 are burdened with an almost uniform mass (i.e., one-fourth the mass of the movable enclosure 505). This results in each wire 507 having almost the same resonance frequency in both the tracking direction and the focusing direction. Should an external perturbation occur in either of these two directions, the other direction is also affected by this perturbation. This can result in, at worst, the movable enclosure 505 moving in circles, and make it difficult to have the laser beam correctly follow a track.

SUMMARY OF THE INVENTION

In order to solve the above problems, the present invention aims, as the first object, to provide an optical pickup that contains a movable enclosure carrying the whole optical system, which performs operations from emission of a laser beam to reception of a return light, and that is capable of keeping correctly focusing the laser beam on a track of an optical recording medium.

The present invention also aims, as the second object, to provide a method for manufacturing the above optical pickup.

The first object can be achieved by an optical pickup, including: a semiconductor laser for emitting a laser beam; an objective lens for focusing the emitted laser beam on an optical recording medium; a first member for carrying at least the semiconductor laser and the objective lens; a second member; and a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member, wherein the plurality of supporting members include at least two supporting members that are electrically conductive, and wherein the at least two electrically conductive supporting members include electrically conductive supporting members that function as lines to conduct power to the semiconductor laser.

For this construction, the conductive supporting members are also used as lines for driving the semiconductor laser so that a flexible printed circuit is no longer necessary for the present optical pickup of the optical-component-integrated type. This increases optical properties of an optical pickup. In addition, a number of parts constituting one optical pickup can be reduced, and so production efficiency enhances.

Here, the supporting members that function as the lines to conduct power may have a larger surface area than other electrically conductive supporting members.

For this construction, heat generated by the semiconductor laser can be released via the supporting members of a larger surface area.

Here, a number of the plurality of supporting members may be at least six, and the plurality of supporting members may be substantially parallel in a longitudinal direction of the plurality of supporting members.

When at least six supporting members are used in this way, variations in properties of different supporting members can be averaged, which allows the optical pickup to smoothly follow movements of a recording surface of an optical recording medium.

Here, the second member may contain a concave in which a base portion of at least one supporting member is present, and the concave may be filled with a damping material that has viscoelasticity so that the base portion is surrounded by the damping material.

With this construction, abnormal resonance generated by the supporting members can be suppressed.

Here, the plurality of supporting members may include a first supporting member and a second supporting member that have different mechanical resonance frequencies.

When the optical pickup contains the plurality of supporting members having different resonance frequencies, a resonance factor for a certain frequency can be reduced. As a result, degradation in precision with which the optical pickup performs a write and a read can be prevented.

For this reason, it is preferable that the first supporting member and the second supporting member are differently shaped or have different widths. It is alternatively possible that the plurality of the supporting members are divided into a plurality of groups, and the second member has a plurality of concaves, in each of which base portions of supporting members of a same group are present. The plurality of concaves may be filled with at least two types of damping materials that have different viscoelasticity.

Here, the plurality of supporting members may be composed of layers of at least two types of members, and the at least two types of members may include a metal plate and an insulating plate. At least two metal plates and at least one insulating plate may be alternatively layered to form each supporting member.

This construction provides a necessary number of conductive members for supplying power to optical components positioned in the first member while reducing the size of the optical pickup as a whole.

Here, each insulating plate may be made of a damping material that has viscoelasticity.

This construction gives a function for suppressing resonance to each supporting member.

Here, the optical pickup may further include a driving unit that has two driving coils which generate a driving force to move the objective lens in a focusing direction and a tracking direction, and the two driving coils may be positioned in the first member in an approximately central portion in a direction perpendicular to: (a) a direction of an optical axis of the objective lens; and (b) a longitudinal direction of the supporting members. Out of the plurality of supporting members, at least six supporting members may be electrically conductive, and the plurality of supporting members may be positioned symmetrically with respect to a position at which the driving coils are positioned, with a number of supporting members on each side of the position being the same. On each side of the position, at least two of the at least six electrically conductive supporting members may be positioned closer to the driving coils than other supporting members.

With this construction, the same number of elastic supporting members are positioned symmetrically with respect to a position of the driving coils. As a result, the plurality of supporting members can movably support the first member while achieving a suitable balance. In addition, when the conductive supporting members closer to the driving coils are used as lines that supply power to the driving coils, a wiring process for other components, such as the semiconductor laser, becomes easier.

Here, the first member may further contain: a first reflecting unit that has a first surface which reflects a laser beam emitted by the semiconductor laser; and a second reflecting unit that has a second surface which reflects the laser beam, which has been reflected by the first surface, toward the objective lens. The first surface and the second surface may be parallel.

For this construction, a principal ray of a laser beam, which has been emitted by the semiconductor laser and enters into the first reflecting unit, is in parallel to a principal ray of the laser beam which has been reflected by the second reflecting unit and enters into the objective lens. As a result, a certain distance can be maintained between these two principal rays even when the semiconductor laser is not precisely positioned during assembly. Accordingly, the precision in positioning optical pickups during assembly can be reduced.

The second object of the present invention can be achieved by a method for manufacturing an optical pickup, the optical pickup including: a first member that carries optical components, which include (a) a semiconductor laser component that emits a laser beam and (b) an objective lens that focuses the laser beam onto an optical recording medium; a second member; and a plurality of supporting members that connect the first member with the second member in a manner that allows the first member to move. The method includes: a supporting member positioning step for positioning at least six supporting members between the first member and the second member, the first member and the second member being positioned at a predetermined interval; and a supporting member connecting step for connecting each supporting member to the first member and to the second member so as to have a substantially uniform stress distributed to each supporting member.

With this method, a uniform stress can be distributed to each supporting member during a connection process so that abnormal resonance can be suppressed when the optical pickup is in actual use and operates.

Here, the plurality of supporting members may be electrically conductive, and the supporting member connecting step may contain a step for soldering at least one end of each supporting member to at least one of the first member and the second member. Alternatively, the supporting member connecting step may contain a step for connecting at least one end of each supporting member to at least one of the first member and the second member, using ultraviolet-hardening resins, or melted glass.

With this method, a supporting length of each supporting member can be made the same by adjusting an amount of solder, ultraviolet-hardening resins, or melted glass. As a result, stress can be further evenly distributed to each supporting member. Note that the aforementioned "supporting length" refers to a length between two connected portions of each supporting member, and the two connecting portions are connected to the first member and the second member, respectively.

The second object can be also achieved by a method of for manufacturing an optical pickup, the optical pickup including: a first member that carries optical components, which include (a) a semiconductor laser component that emits a laser beam and (b) an objective lens that focuses the laser beam onto an optical recording medium; a second member; and a plurality of supporting members that connect the first member with the second member in a manner that allows the first member to move. The method includes: a plate processing step for processing two electrically conductive plates to form two structural members that have a shape of a plurality of supporting members linked to an outer part of each conductive plate; and a first member forming step for having the two structural members held so that a predetermined positional relationship between the two structural members can be maintained, and forming at least the first member, out of the first member and the second member, in predetermined portions of the plurality of supporting members.

For this method, a process to connect each supporting member to at least the first member does not need to be independently performed, so that production efficiency can be enhanced. Also with this method, at least the first member is formed, with a position of each supporting member being fixed. This prevents the supporting members from being distorted, and so suppresses variations in properties of different optical pickups.

Here, the plate processing step may further include a step for performing a bending process on portions of supporting members in at least one of the two structural members.

When a terminal portion of each supporting member of at least one of the two structural members is bent as a subportion and brought to a position suitable to be connected to the optical components such as the semiconductor laser, this connection process can be facilitated.

In the first member forming step, the first member and the second member may be simultaneously molded out of resins in a manner that the predetermined portions of the plurality of supporting members are embedded in the first member and the second member.

With this method, a molding process for the first member and the second member can be performed simultaneously with a connection process for each supporting member to the first member and the second member. This highly facilitates the production efficiency.

In the above first member forming step, "insert molding" is performed to form the first member and the second member. The insert molding refers to molding methods such as injection molding and transfer molding, and each supporting member becomes integral with the optical pickup through this insert molding. For the optical pickup of the present invention, injection molding, which uses melted resins, should be preferably performed to reliably prevent the supporting members from being distorted during molding.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

The following describes embodiments of the present invention with reference to drawings.

First Embodiment

Figure 3:
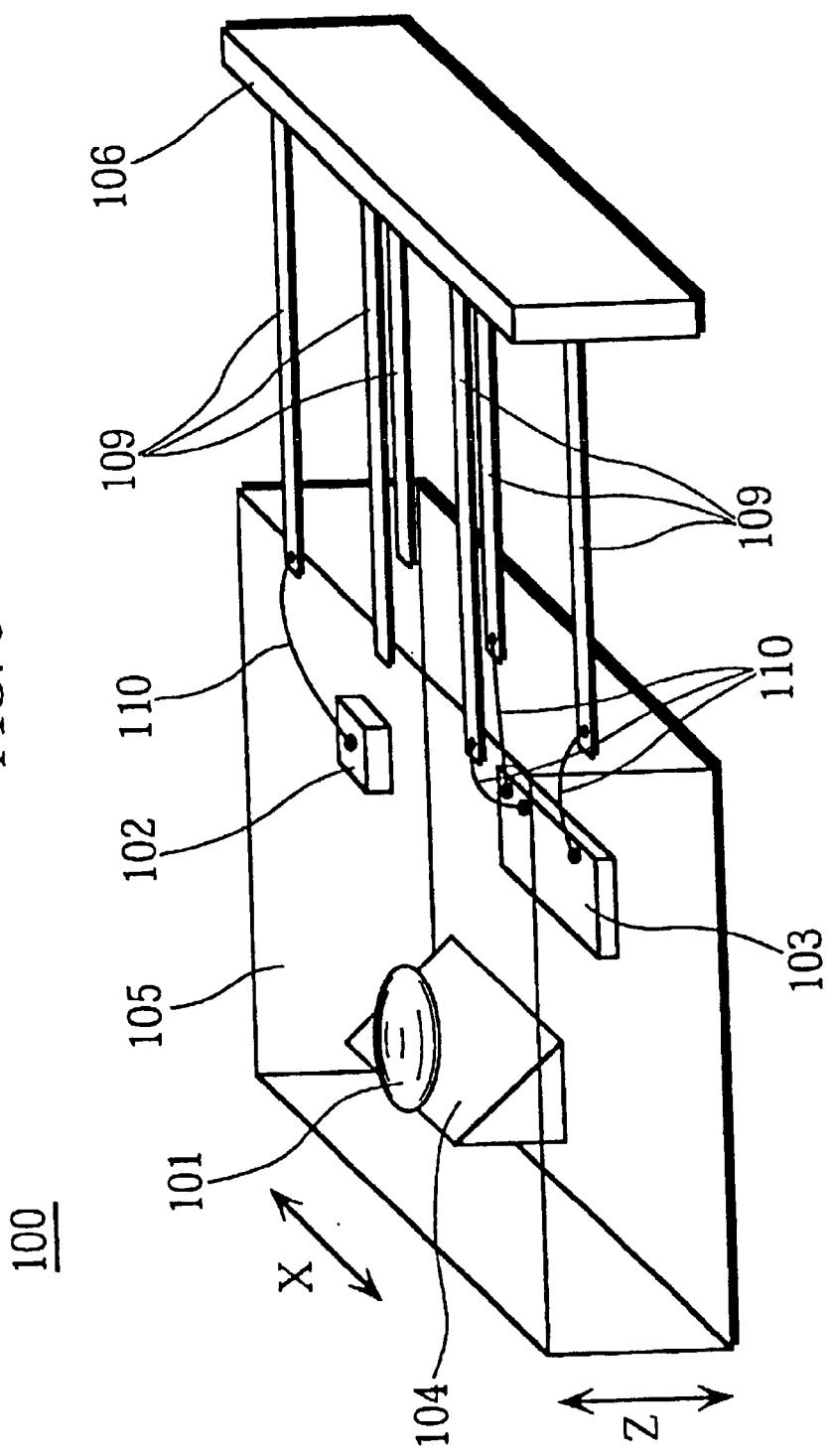
FIG. 3 shows a construction of an optical pickup of in perspective view according to the first embodiment of the present invention.

FIG. 3 shows a simplified construction of an optical pickup 100 of the first embodiment of the present invention in perspective view. To clearly show connections between components inside a movable enclosure and wires, the movable enclosure is shown transparentized.

As shown in the figure, the present optical pickup 100 includes a movable enclosure 105, a fixed member 106, and six wires 109 which are supporting members. The fixed member 106 holds the movable enclosure 105 via the six wires 109. The movable enclosure 105 contains the following components in its inside: an objective lens 101; a semiconductor laser 102; a photodetector 103; and a raising mirror 104, and so on. A driving coil, and optical devices, such as a beam splitter, that are positioned between the semiconductor laser 102 & the photodetector 103, and the raising mirror 104 are not shown in the figure. The movable enclosure 105 is supported by a fixed member 106 via six wires 109 in a manner that allows the movable enclosure 105 to move in both the tracking direction (a direction "X" in the figure) and the focusing direction (a direction "Z").

To plainly show the present optical pickup 100, not all the bonding wires 110 are shown in the figure.

Figure 1:
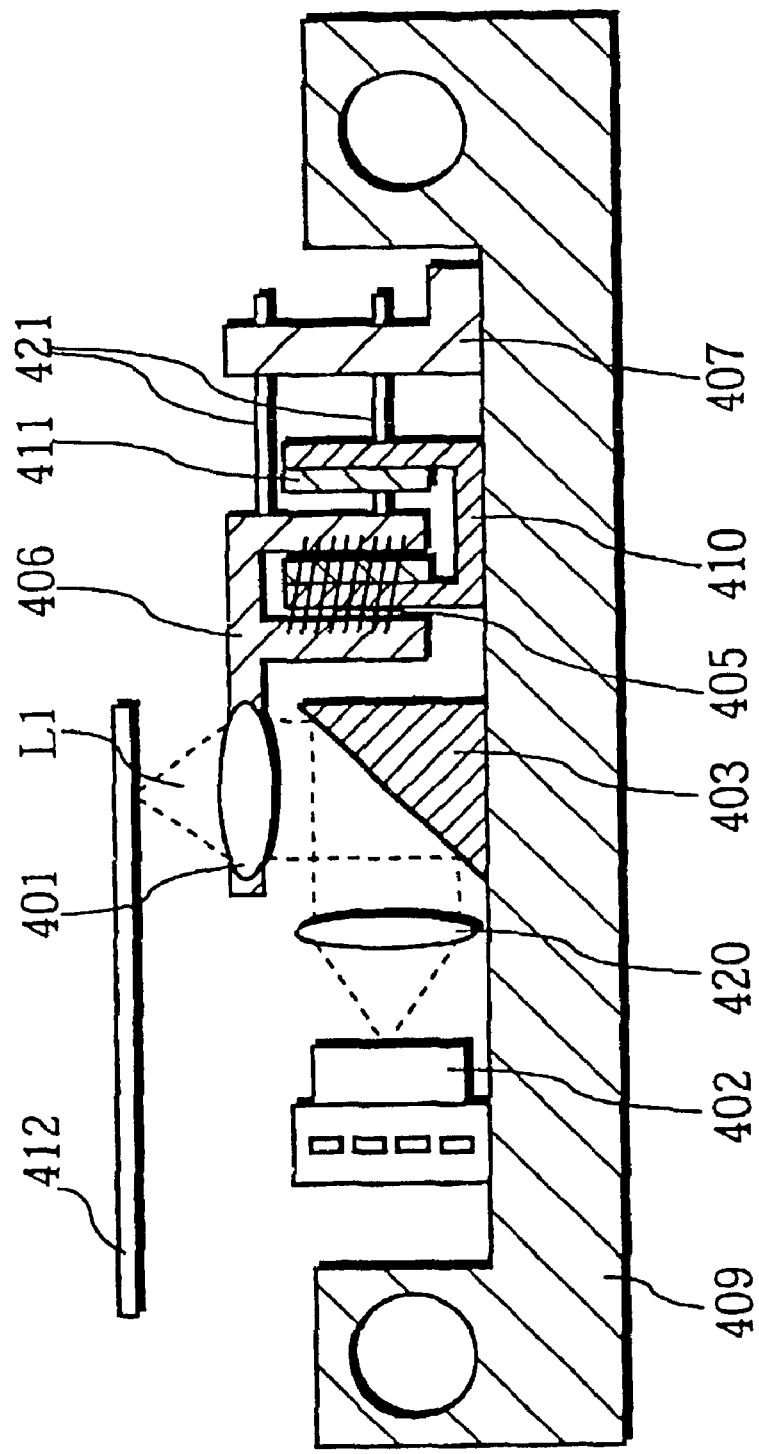
FIG. 1 shows a construction of principal parts of a conventional optical pickup in vertical section view.
Figure 2:
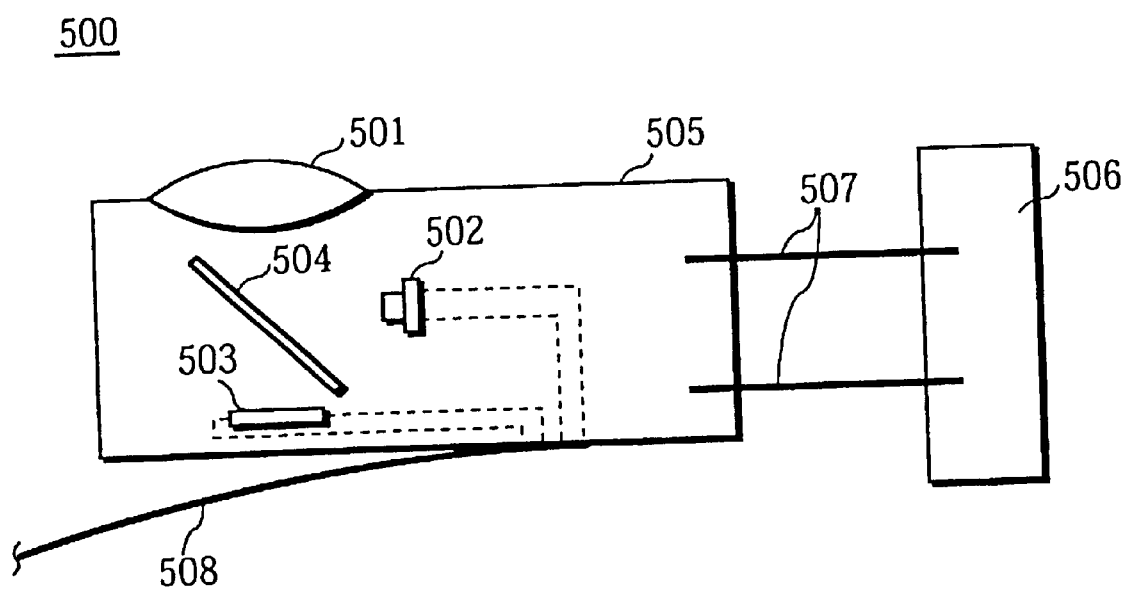
FIG. 2 shows a construction of principal parts of a conventional optical pickup of the optical-component-integrated type in vertical section view.

Of the six wires 109, three of them (hereafter called "an upper wire group") connect upper portions of the optical pickup 100, and other three wires (hereafter "a lower wire group") connect lower portions of the optical pickup 100. Three wires in the upper and lower wire groups are positioned at equal intervals and in parallel to one another, and have a favorable conductivity. The six wires 109 are insulated from one another, and ends of some wires 109 are electrically connected via bonding wires 110 to the semiconductor laser 102 or the photodetector 103. This allows the six wires 109 to be also used as lines (hereafter, "power-supplying lines") for supplying power and signal lines, and therefore a conventional flexible printed circuit as shown in FIG. 2 becomes no longer necessary although the present optical pickup is of the stated optical-component-integrated type. Consequently, unnecessary resonance that degrades optical properties of the optical pickup is not produced.

In addition, the six wires 109 help average variations in properties of wires 109 responding to a vertical movement and a horizontal movement of the movable enclosure 105 more effectively than four wires that are used for the conventional optical pickup. This allows the optical pickup 100 to smoothly follow movements of an optical disc. At the same time, increase in temperatures of the semiconductor laser 102 and the photodetector 103 can be reduced since the wires 109 release or conduct heat generated by the semiconductor laser 102 and the photodetector 103. As a result, an optical pickup, which is capable of performing a read and a write involving very few errors, can be provided.

Morever, as the six wires 109 are insulated from one another, a necessary number of electrode terminals to drive the semiconductor laser 102 and the photodetector 103 and to output signals can be obtained.

When three wires 109 in the upper and lower wire groups are positioned at equal intervals and in parallel to one another, a uniform load can be given to each wire 109 without a huge load being given to only one wire 109. As a result, abnormal resonance can be prevented from being produced, and therefore the optical pickup 100 can smoothly follow movements of the optical recording medium.

Figure 4:
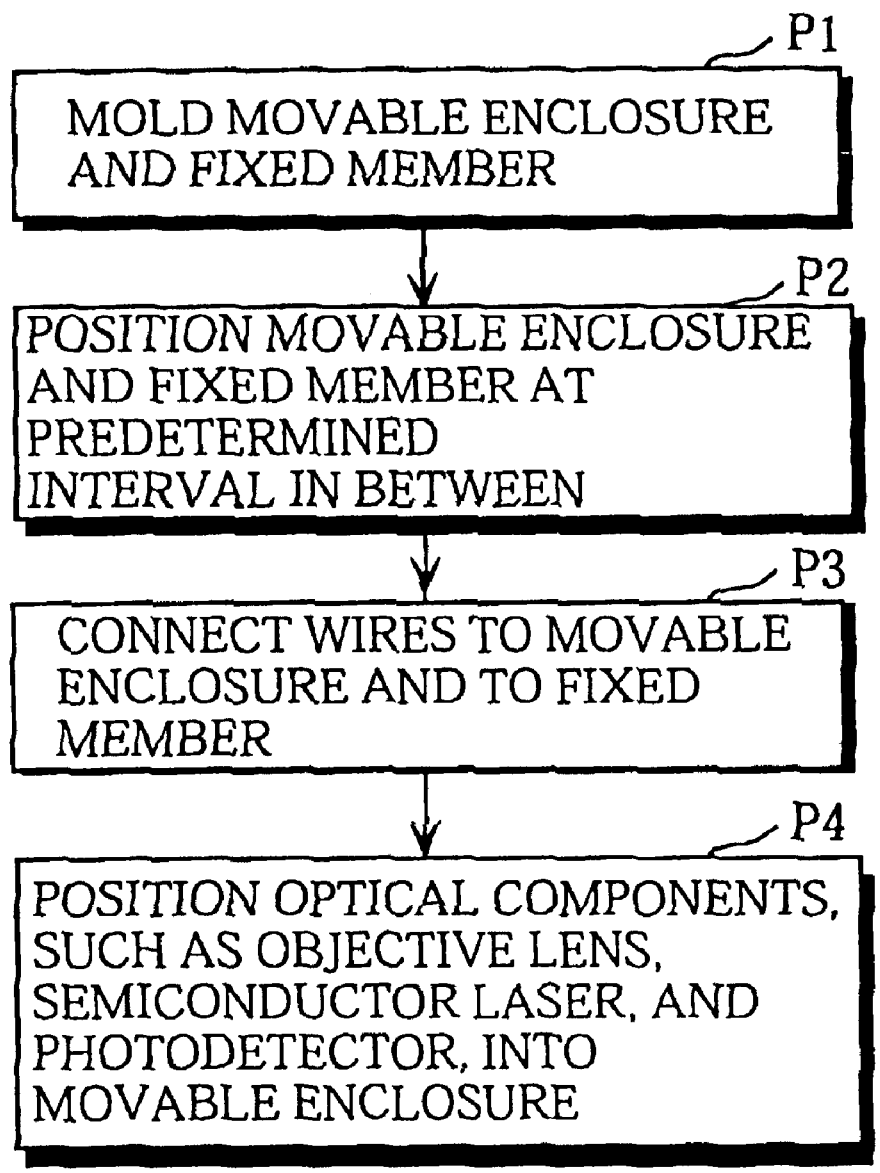
FIG. 4 shows a flow of a manufacturing method for the optical pickup of the first embodiment.

FIG. 4 shows an example flow of a manufacturing method for the optical pickup 100.

The movable enclosure 105 and the fixed member 106 are formed (P1). This can be performed by molding bodies of the movable enclosure 105 and the fixed member 106 out of resins, and attaching a wiring board to side surfaces, to which the wires 109 are connected, of the movable enclosure 105 and that of the fixed member 106.

The movable enclosure 105 and the fixed member 106 are positioned at a predetermined interval in between (P2). Three wires 109 in the lower wire group are positioned in a predetermined position between the movable enclosure 105 and the fixed member 106, and ends of the wires 109 are soldered to the movable enclosure 105 and the fixed member 106. Similarly, wires 109 in the upper wire group are soldered at their ends to the movable enclosure 105 and the fixed member 106 (P3).

The process in P3 is performed by robots, so that optical pickups can be mass-produced without variations in the different optical pickups being generated.

Figure 5A:
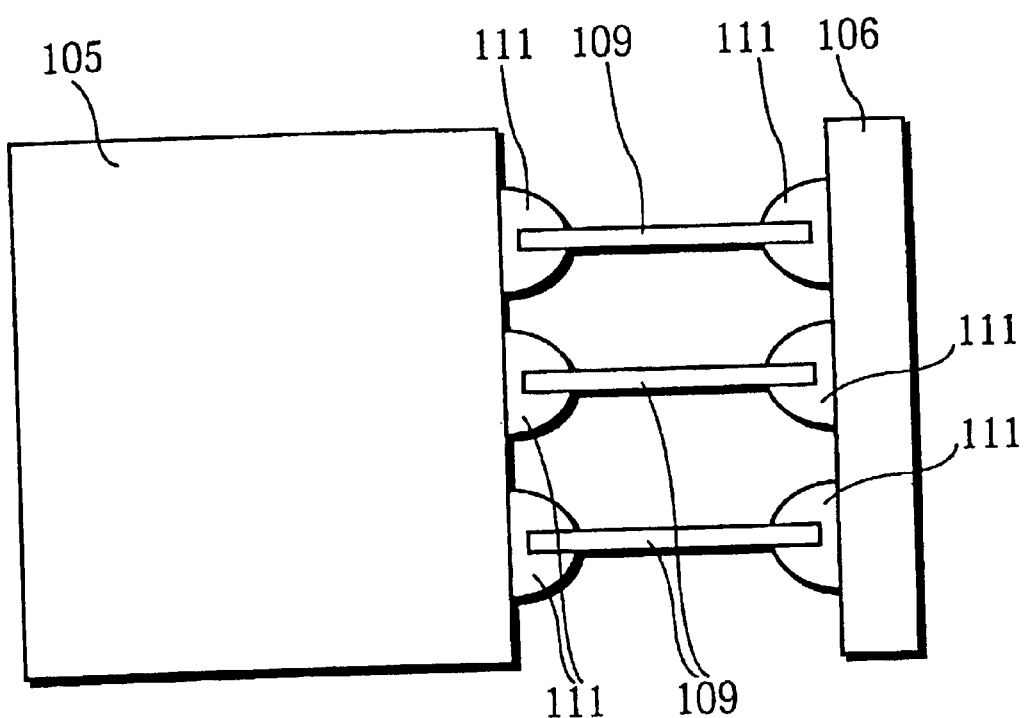
FIG. 5A shows a state of wires soldered to a movable enclosure and a fixed member in the manufacturing method shown in FIG. 4.

FIG. 5A shows an example state of the wires 109, which are connected between the movable enclosure 105 and the fixed member 106 according to the above method.

As stated above, wiring boards (not shown in the figure) are attached onto wiring sides of the movable enclosure 105 and of the fixed member 106. Metal films, which are easy to be soldered to, are applied onto portions of the wiring board to which wires 109 should be connected. Three wires 109 in each wire group are fixed via the solder joints 111 onto the wiring boards of the movable enclosure 105 and of the fixed member 106 at uniform intervals and in parallel to one another.

The six wires 109 are about 15 mm long, 100 $\mu$m wide, and 50 $\mu$m thick, and are made of, for instance, phosphor bronze, beryllium copper, or titanium copper. The movable enclosure 105 is made of resin, for instance, and is eighteen mm long in the direction of the length of the wires 109, fourteen mm long in the direction "X", and 3.4 mm thick.

Phosphor bronze, beryllium copper, and titanium copper are chemically stabilized and so are rust-resistant. This allows the optical pickup 100 to maintain high trackability semipermanently.

Figure 5B:
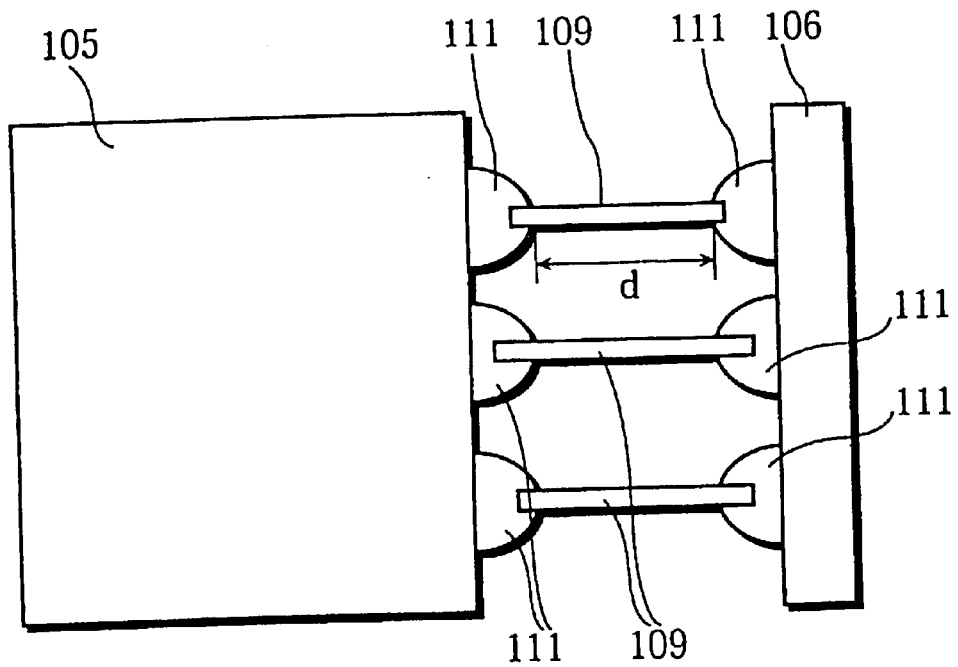
FIG. 5B shows a state in which an amount of solder is adjusted to make a supporting length of each supporting member the same when each supporting member has a different length.

Even when the six wires 109 have different lengths, it is possible to give a uniform stress to each wire 109 by adjusting an amount of each solder joint 111 as shown in FIG. 5B within a range that allows both ends of each wire 109 to reach solder joints 111 so as to make a length "d" from one tip of a solder joint 111 to another the same for all the wires 109. Note that this length "d" is equal to the aforementioned supporting length between two connected portions of each supporting member. This prevents a large load from being given to only one wire 109, and therefore abnormal resonance does not occur.

Following the process of P3 for connecting the wires 109, optical components such as the objective lens 101, the semiconductor laser 102, and the photodetector 103 are positioned into the movable enclosure 105. The semiconductor laser 102 and the photodetector 103 are connected via bonding wires to a wiring board to which wires 109 are connected (P4). This completes the manufacturing process of the optical pickup 100. Note that the above process of P4 may be performed before the process of P3 for connecting the wires 109.

A method to fix the wires 109 to the movable enclosure 105 and the fixed member 106 is not limited to the above soldering. Instead, other methods may be used, such as a method to apply ultraviolet (UV)-hardening resins to the junctions and to irradiate the resins with a UV ray, or a method to apply melted glass to the junctions and cool it down. With these alternative methods, it is necessary to provide electrical connection between the wires 109 and the semiconductor laser 102 or the like by soldering lead lines onto ends of the wires 109 since both the UV-hardening resins and melted glass are electrically insulating materials.

Alternatively, it is possible to use an "insert molding method" to fix the wires 109 to the optical pickup 100. According to this method, resins are injected into molds of the movable enclosure 105 and the fixed member 106 which hold ends of the wires 109. This method not only facilitates a connecting process of the wires 109 but also helps distribute stress to each wire 109 evenly. This insert molding method will be described in another embodiment in detail.

The present embodiment describes the number of the wires 109 as six. However, the number of the wires 109 may be higher than six when more power-supplying lines or signal lines are necessary such as when the photodetector 103 needs more terminals, or a driving coil is positioned into the movable enclosure 105.

When four wires support a movable enclosure as in the conventional optical pickup, a resonance frequency becomes equal in both vertical and horizontal directions. Should external perturbations occur in one of these directions, the movable enclosure can move in circles in an extreme case. With the present optical pickup 100, on the other hand, six supporting members are used, with three supporting members being horizontally positioned in the upper and lower portions of the optical pickup 100 and two supporting members being positioned vertically in each connecting portion of the optical pickup 100. This can prevent abnormal circle movements, which occur in the conventional optical pickup, from occurring. Generally, when the higher number of supporting members are used, influence of variations in other structural members becomes less, so that abnormal resonance will not occur. Also, when a larger difference is provided between the number of supporting members positioned vertically and the number of supporting members positioned horizontally, unnecessary movements such as circle movements can be prevented more effectively. In any of the above cases, it is desirable to position an even number of supporting members symmetrically in the directions "X" and "Y" with respect to a center line of the movable enclosure 105 to evenly distribute stress to the wires 109. This is because abnormal vibrations are likely to occur when a large stress is distributed to only certain wires. Here, the above center line of the movable enclosure refers to a line which passes through a center of gravity of the movable enclosure 105 and which is parallel to a direction of the length of wires 109.

It is also possible to enlarge a width of each wire 109 that is connected to the semiconductor laser 102 to thereby give a larger surface area to this wire 109 than to other wires 109. This allows heat generated by the semiconductor laser 102 to be released outside via this wire 109 more effectively. Alternatively, it is possible to extend this wire 109 of the enlarged width into the movable enclosure 105 and connect the extended wire 109 directly to the semiconductor laser 102 to release heat further more effectively. Usually, two wires are required to supply currents to a semiconductor laser. Accordingly, it is desirable to prepare four wires, of which two are used as the power-supplying lines, that are wider than other wires, and to position the four wires symmetrically in the vertical and horizontal directions with respect to the center line of the movable enclosure 105 in order to distribute stress to these wires 109 evenly.

Second Embodiment

Figure 6:
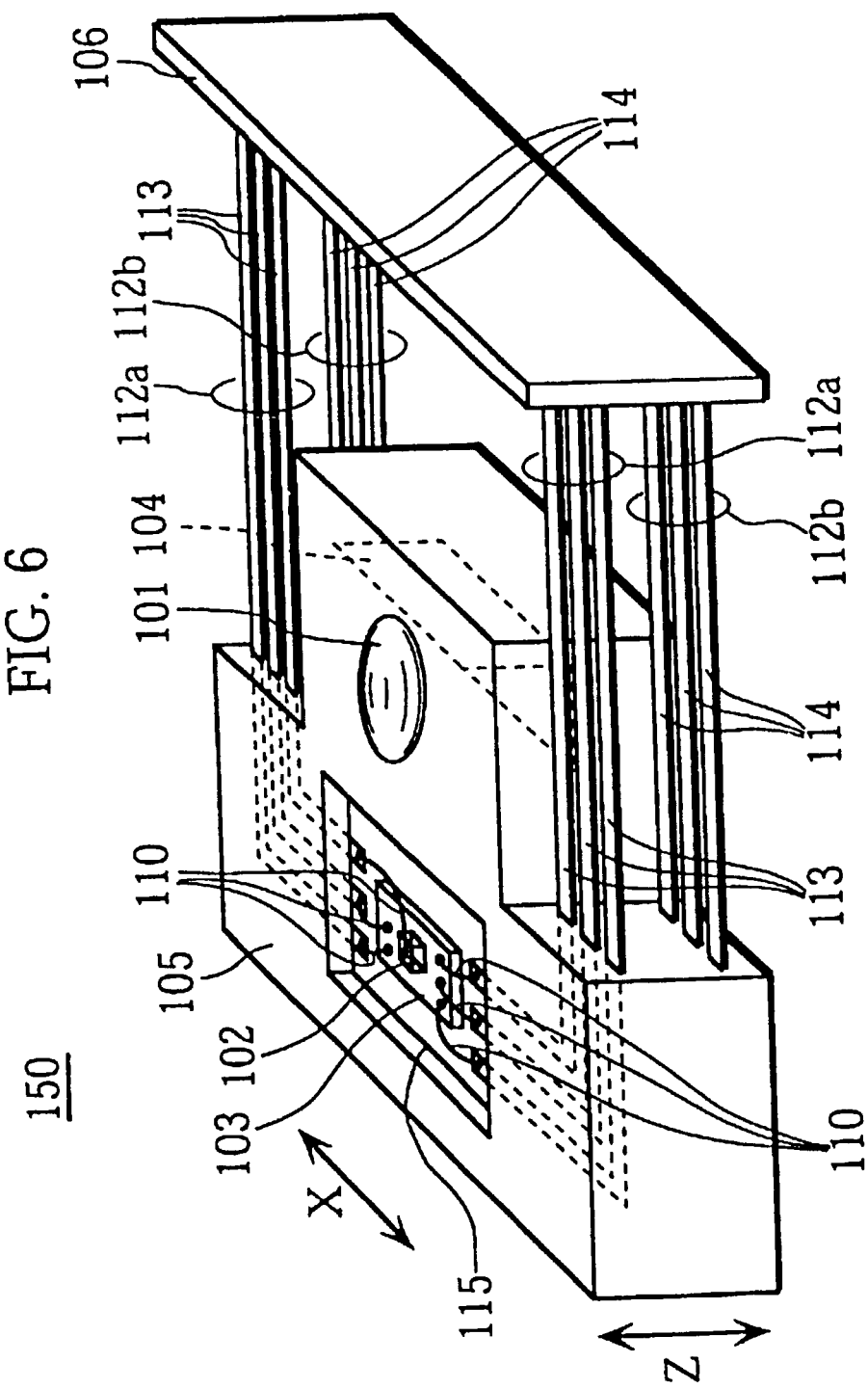
FIG. 6 is a perspective view of a construction of an optical pickup according to the second embodiment.

FIG. 6 is a perspective view of a simplified construction of an optical pickup 150 according to the second embodiment.

As shown in the figure, the present optical pickup 150 includes a movable enclosure 105, into which the following components are positioned: an objective lens 101; a semiconductor laser 102; a photodetector 103; a raising mirror 104; and other components. The movable enclosure 105 is supported by a fixed member 106 via four wire groups 112a and 112b. Optical components, such as a beam splitter, which are positioned between the semiconductor laser 102 & the photodetector 103, and the raising mirror 104 are omitted in the figure since such components' constructions are well-known and the present optical pickup 150 can be plainly shown without these components being shown.

The four wire groups 112a and 112b are composed of: (a) two wire groups 112a that each contain three wires 113; and (b) two wire groups 112b that each contain three wires 114. The wire group 112a connects upper portions of the movable enclosure 105 with those of the fixed member 106, and the wire group 112b connects lower portions of the movable enclosure 105 with those of the fixed member 106. Three wires 113 and 114 in each wire group are positioned at intervals of about 200 μm and in parallel to one another to keep one wire from contact with another when the wires 113 and 114 are bent to a certain extent. The wires 113 and 114 are about 15 mm long between the movable enclosure 105 and the fixed member 106, about 100 μm wide, and about 50 μm thick, and are made of, for instance, phosphor bronze, beryllium copper, or titanium copper.

The wires 113 are inwardly bent in the form of the letter "L" inside the movable enclosure 105, and their end portions form junctions with optical components positioned into the movable enclosure 105.

The movable enclosure 105 and the fixed member 106 are made of resin, for instance, and the movable enclosure 105 is 18 mm in the direction of the length of the wires 113–114, 14 mm deep in the direction "X", and 3.4 mm thick.

The junctions formed by the wires 113 are electrically connected via a plurality of bonding wires 110 to the semiconductor laser 102 and the photodetector 103 which are positioned into the movable enclosure 105. FIG. 6 shows only some of all the bonding wires 110 to clearly show connections.

The four wire groups 112a and 112b connect the movable enclosure 105 with the fixed member 106 in a manner that allows the movable enclosure 105 to swing. These wire groups 112a and 112b can be also used as power-supplying lines and signal lines. Accordingly, the conventional flexible printed circuit 508 is no longer necessary so that unnecessary resonance can be prevented from occurring.

Especially for the present embodiment, the wire groups 112a and 112b are each composed of three wires 113 and 114, so that stress is distributed evenly to each wire within each wire group. Consequently, abnormal resonance can be prevented from occurring more effectively than when only one wire 109, instead of a group of wires, is used as one supporting member as in the first embodiment.

Moreover, phosphor bronze and beryllium copper used for the wires 113–114 are more rust-resistant than copper, which allows the optical pickup 150 to operate with stability for a long time regardless of use environments.

The following describes a method to produce the optical pickup 150 of the present embodiment with reference to FIGS. 7A–7E.

Figure 7A:
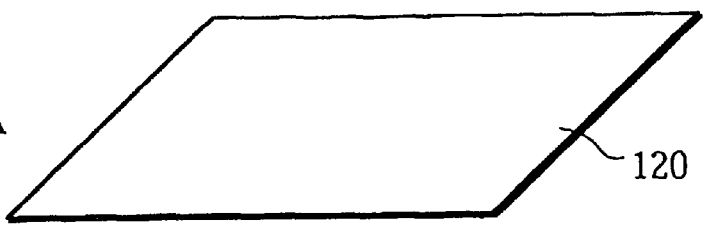
FIGS. 7A–7E show manufacturing processes for the optical pickup of FIG. 6.
Figure 7B:
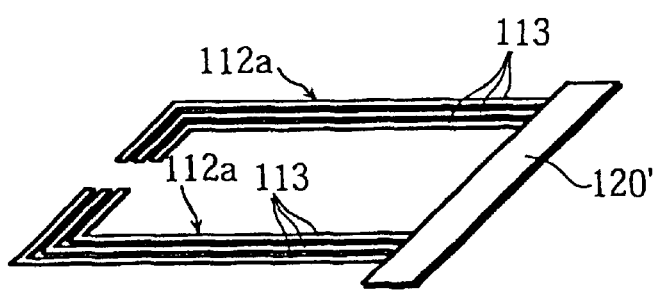

A metal plate 120 as shown in FIG. 7A is prepared to produce the present optical pickup 150. For instance, this metal plate 120 is about 50 μm thick, and is made of phosphor bronze, beryllium copper, or titanium copper. By performing etching or presswork for the metal plate 120, a metal plate 120' that has two wire groups 112a is produced as shown in FIG. 7B.

Insert molding process is performed using this metal plate 120' as follows. Predetermined portions of the metal plate 120' are sandwiched with molds of an upper half 115a (hereafter called "an upper enclosure 105a") of the movable enclosure 150 and with molds of an upper half 116a (hereafter "an upper member 106a") of the fixed member 106. Resins are injected into these molds.

Figure 7C:
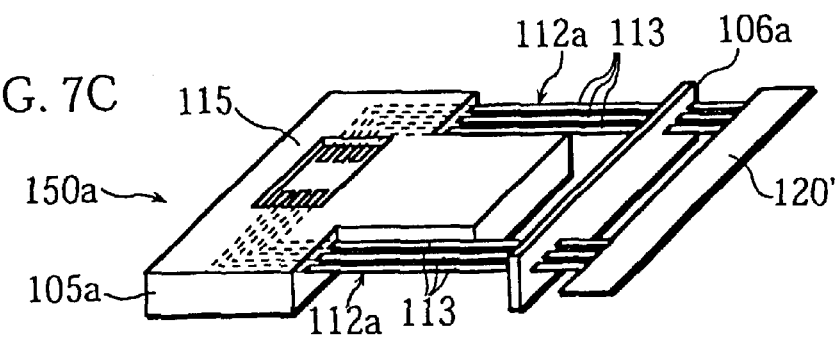
Figure 7D:
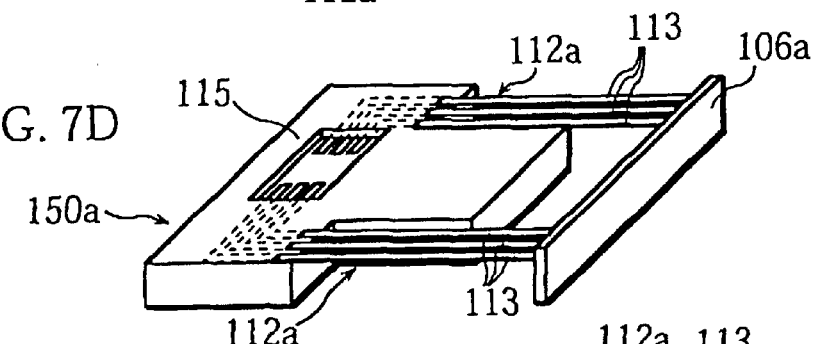

Following this, unnecessary portions, which are portions shown to the right of the upper member 106a in FIG. 7C, are cut and removed, so that an upper body 150a of the preset optical pickup 150 is produced as shown in FIG. 7D.

Figure 7E:
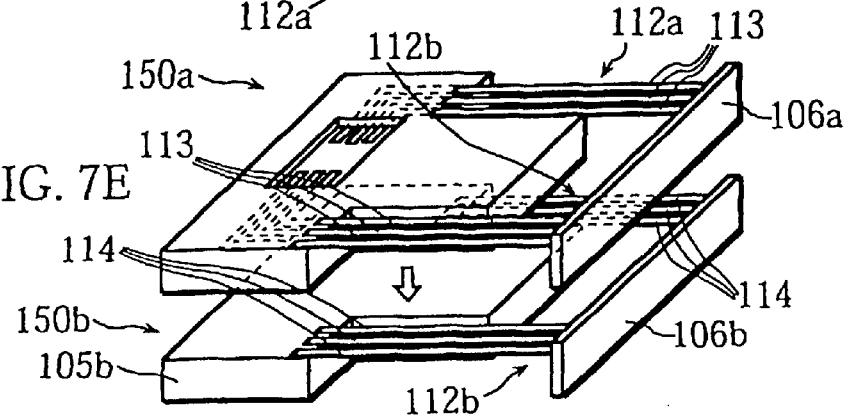

In a similar process to a process used for the upper body 150a, a lower body 150b of the optical pickup 150 is produced. The upper body 150a and the lower body 150b are joined together using an adhesive as shown in FIG. 7E. As a result, the movable enclosure 105 and the fixed member 106 which are connected with the wire groups 112a and 112b can be obtained.

After this, optical components, such as the objective lens 101, the semiconductor laser 102, and the photodetector 103, are built into the movable enclosure 115, so that the optical pickup 150 is eventually manufactured.

In the above method, unnecessary portions to the right of the upper member 106a and of the lower member 106b are removed before the upper body 150a and the lower body 150b are joined together. However, it is possible to remove all these unnecessary portions together after the upper body 150a and the lower body 150b have been joined together. Also, optical components, such as the objective lens 101, the semiconductor laser 102, and the photodetector 103, may be positioned inside the movable enclosure 105 before the upper body 150a and the lower body 150b are joined together.

Manufacturing the optical pickup body according to the above insert molding method has advantages as follows.

(1) The molding process for the upper body 150a can be performed simultaneously with the connection process for wire groups 112a, and the molding process for the lower body 150b can be performed simultaneously with the connection process for the wire groups 112b. By only joining the upper body 150a and the lower body 150b together, the optical pickup 150 can be manufactured, and therefore processes such as soldering which requires a considerable amount of time and labor are no longer necessary. As a result, the manufacture process can be simplified, and so a manufacturing cost can be reduced.

(2) A uniform thickness can be obtained for each wire making up each of the wire groups 112a and 112b as each wire is manufactured from the same metal plate 120. As a result, variations in properties, such as an elastic coefficient, of wires can be reduced. Moreover, when etching or presswork are performed for the metal plate, a great number of wires can be manufactured at a time. This can also reduce a manufacturing cost of optical pickups.

(3) A plurality of wires 113 and 114 can be easily handled because insert molding is performed for the wires 113 and 114 which are in a form of the metal plate 120', and unnecessary portions are removed later. In addition, the insert molding process can provide a uniform connection state of the wires 113 and 114 to the movable enclosure 105 and to the fixed member 106 by achieving a uniform supporting length and a uniform stress for each wire. As a result, conventionally-generated variations in the connection state between different optical pickups due to processes such as the soldering can be reduced. As a result, optical pickups that can perform a write and a read that are more reliable can be achieved.

Third Embodiment

Figure 8:
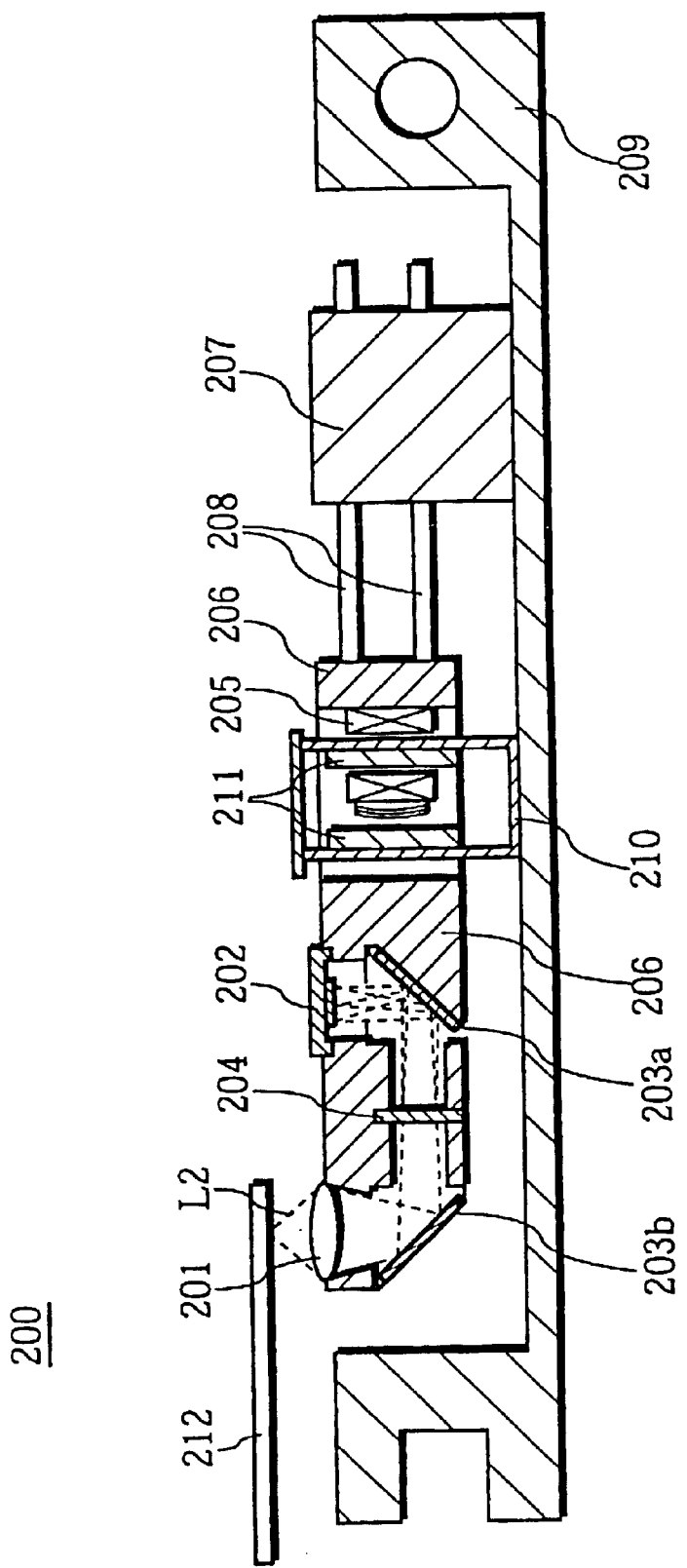
FIG. 8 shows a vertical section of an optical pickup of the third embodiment.

FIG. 8 shows a vertical section of an optical pickup 200 of the present embodiment.

As shown in FIG. 8, the present optical pickup 200 includes a movable enclosure 206 into which the following components are positioned: an objective lens 201; an integrated component 202 containing a semiconductor laser and a photodetector which are formed on a semiconductor substrate; mirrors 203a–203b; a hologram optical component 204; and driving coils 205. The movable enclosure 206 is supported by sixteen supporting members 208 in a manner that allows the movable enclosure 206 to swing with respect to the fixed member 207.

The fixed member 207 and a yoke 210 that holds magnets 211 are fixed on an optical base 209. Currents passed through the driving coils 205 inside the movable enclosure 206 interact with a magnet field generated by the magnets 211, so that Lorentz forces are generated, and the movable enclosure 206 moves in the focusing direction and the tracking direction with respect to an optical recording medium 212.

Fourteen supporting members 208, out of all the sixteen supporting members 208, are not shown in the figure because eight of them exist in the other half of the optical pickup 200 which is not shown in the figure, and six of them are hidden by two supporting members 208 shown in this figure. Ends of the supporting members 208 at the side of the fixed member 207 are connected via a flexible printed circuit or the like to circuits such as a control circuit. A light beam L2 in the figure shows a laser beam emitted by the semiconductor laser and a return beam which has been reflected on the optical recording medium 212.

Figure 9:
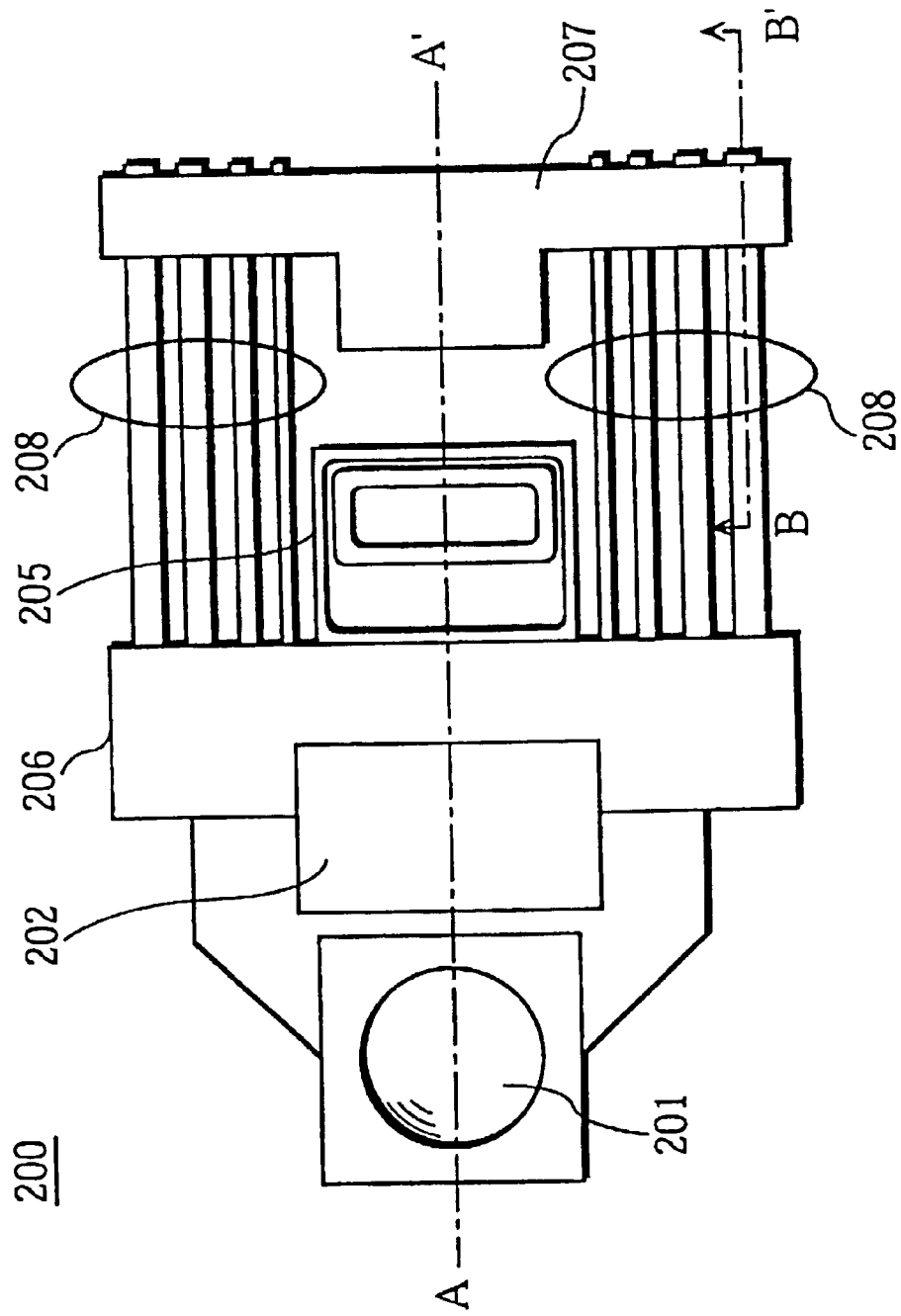
FIG. 9 is a plan view showing the optical pickup in FIG. 8.

FIG. 9 is a plan view showing the optical pickup 200 viewed from above. This figure does not show the optical base 209 and the magnets 211 shown in FIG. 8 to plainly show other components. As shown in the figure, the supporting members 208 are positioned in parallel to one another and symmetrically with respect to a center line A–A' of the optical pickup 200. The supporting length of each supporting members 208 is the same. These supporting members 208 are produced together with the movable enclosure 206 and the fixed member 207 through the insert molding process.

The supporting members 208 have different widths, with a supporting member positioned nearer to the center line A–A' being narrower, and changes in their widths take place symmetrically with respect to the center line A–A'. By giving different widths to the supporting members 208 in this way, different elastic coefficients can be assigned to the supporting members 208. This can prevent all the supporting members 208 from having the same resonance frequency, and therefore reduce a resonance factor for a certain resonance frequency. Accordingly, abnormal resonance that can affect the precision with which the optical pickup 200 perform a read/write can be suppressed.

It is alternatively possible to change widths of the supporting members 208 in a manner that a member nearer the center line A–A' has a wider width although FIG. 9 shows the supporting members 208 in the opposite manner. The supporting members 208 are made of beryllium copper although they may be made of phosphor bronze or titanium copper, instead.

The supporting members 208 are insulated from one another, and also used as power-supplying lines and signal lines for the semiconductor laser and the photodetector.

Figure 10:
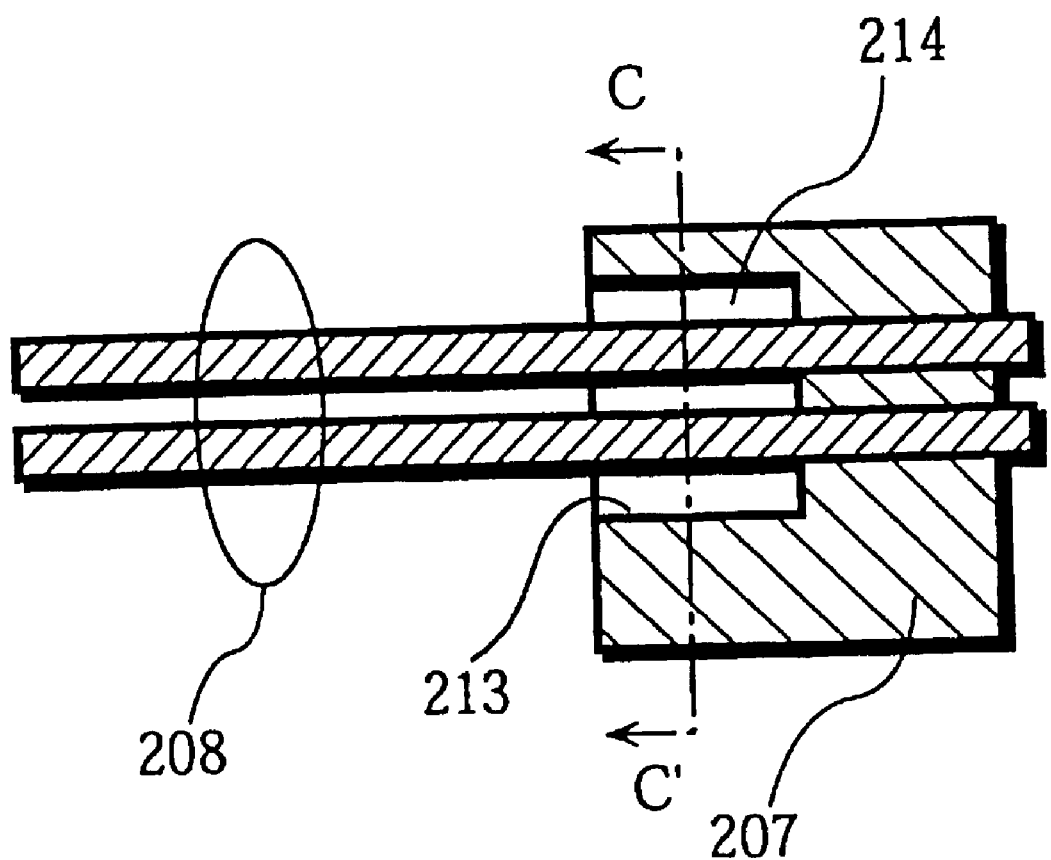
FIG. 10 shows a fixed member and supporting members in vertical section view obtained by cutting along the line B–B' in FIG. 9.

FIG. 10 shows the fixed member 207 and the supporting members 208 in vertical section view obtained by cutting along the line B–B' in FIG. 9.

As shown in the figure, ends of the supporting members 208 are embedded into the fixed member 207, which has a concave 213 on the side of the moving enclosure 206. The concave 213 is filled with a damping material 214 made of UV-hardening silicon gel, which encloses base portions of the supporting members 208. This damping material 214 absorbs vibrations so that generation of resonance for each supporting member 208 can be further suppressed.

Figure 11:
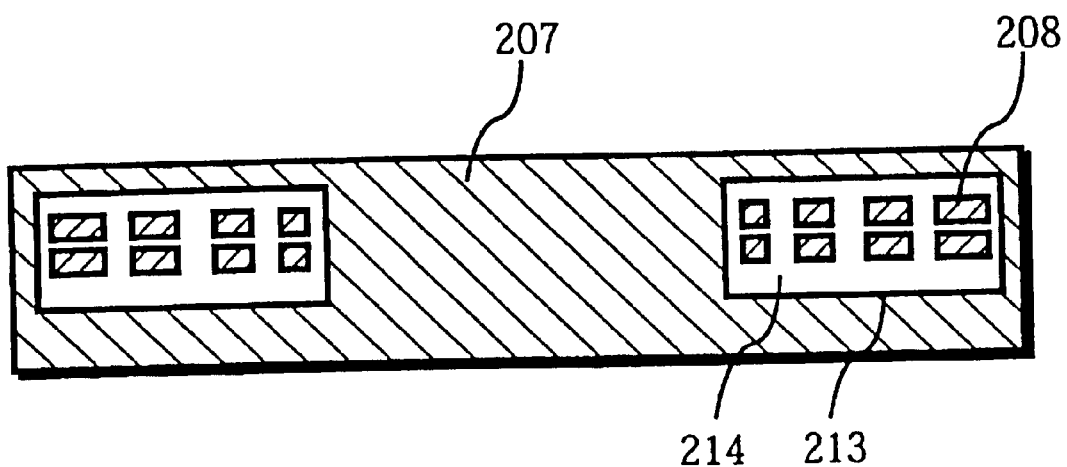
FIG. 11 is a section view obtained by vertically cutting the fixed member along a line C–C' in FIG. 10.

FIG. 11 is a section view obtained by vertically cutting the fixed member 207 along a line C–C' shown in FIG. 10. As shown in the figure, base portions of eight supporting members 208 are present in each concave 213, which is contained on the left and right of the fixed member 209, so that resonance can be separately prevented on the right and left sides.

The following describes a manufacturing method of the optical pickup 200 of the present embodiment with reference to FIGS. 12A–12E.

Figure 12A:
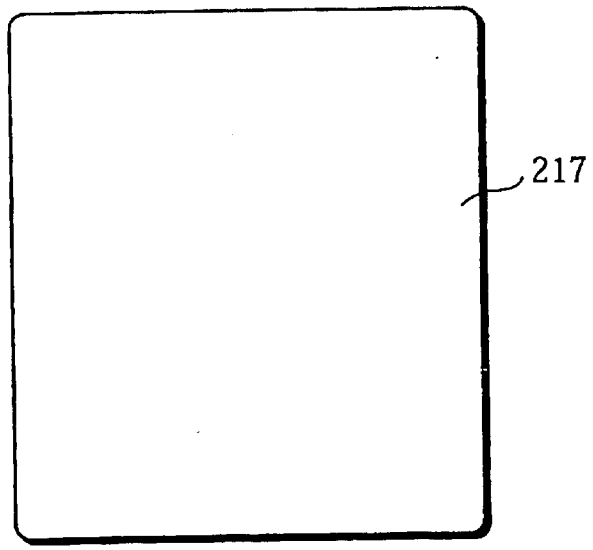
FIGS. 12A–12E show a manufacturing method of the optical pickup of the third embodiment.
Figure 12B:
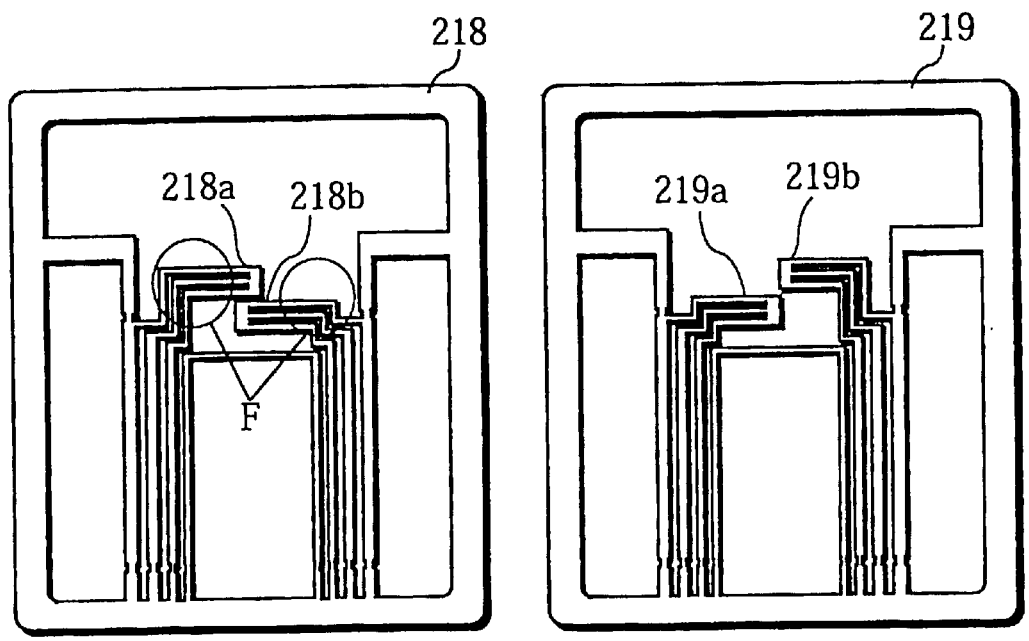
Figure 12C:
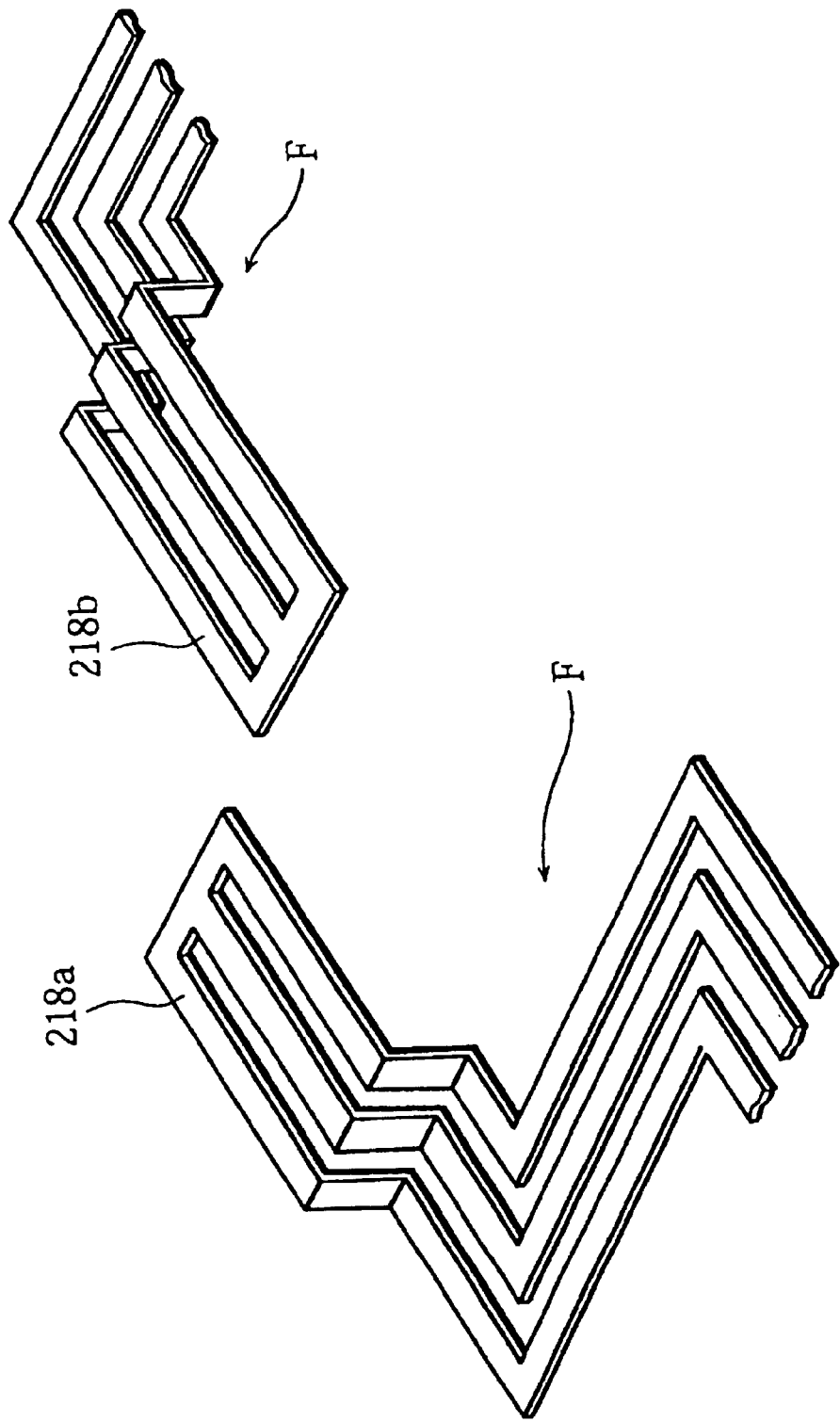

Etching or presswork are performed for a thin metal plate 217 as shown in FIG. 12A so that a first metal plate 218 is manufactured. Similarly, a second metal plate 219 is manufactured. The first and second metal plates 218 and 219 contain portions that are to form the supporting members 208. A presswork is performed for portions around "F" in FIG. 12B of the first metal plate 218 so as to raise, as shown in a magnified view of FIG. 12C, surfaces of terminal portions 218a–218b up to the height of the upper supporting member 208 shown in FIG. 8.

The first metal plate 218 and the second metal plate 219 are positioned, with the former lying below the latter. Predetermined portions of the first and second metal plates 218 and 219 are sandwiched between molds of the movable enclosure 206 and the fixed member 207, and then an insert molding process is performed by injecting resins to them. As a result, a body of the optical pickup 200 can be obtained as shown in FIG. 12D.

The above molds have shapes that allow the movable enclosure 206 and the fixed member 207 to be molded at the same time. As a result, the movable enclosure 206 and the fixed member 207 can be produced through only one molding process.

Figure 12D:
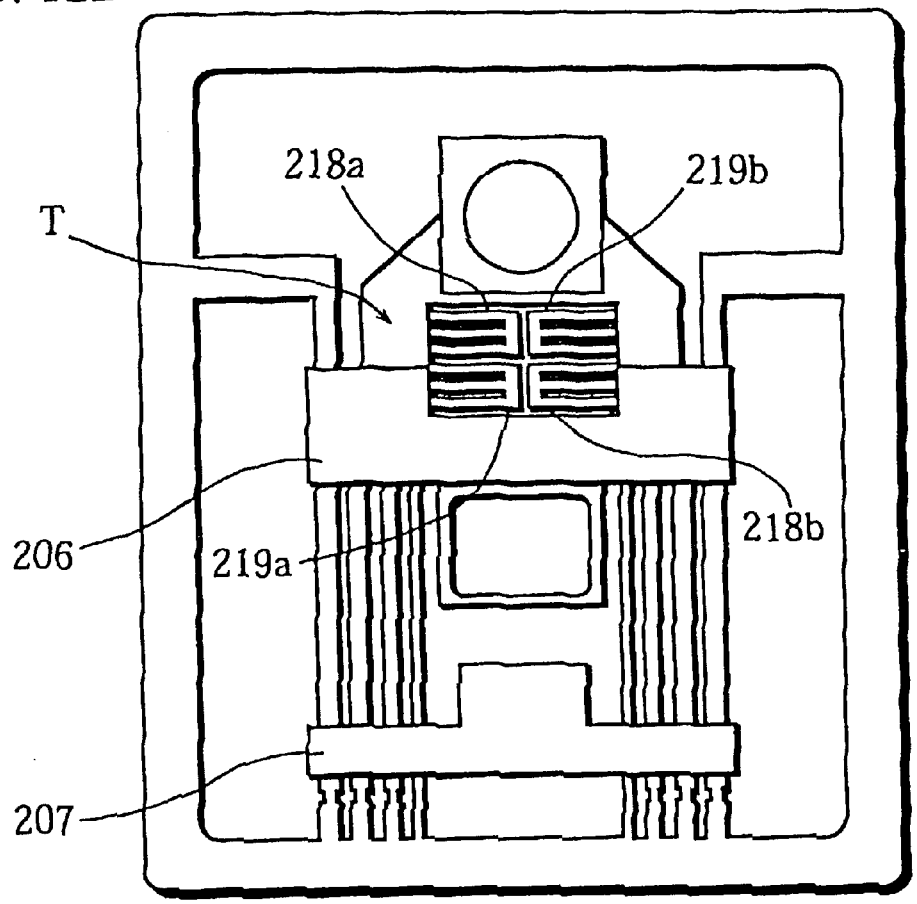
Figure 12E:
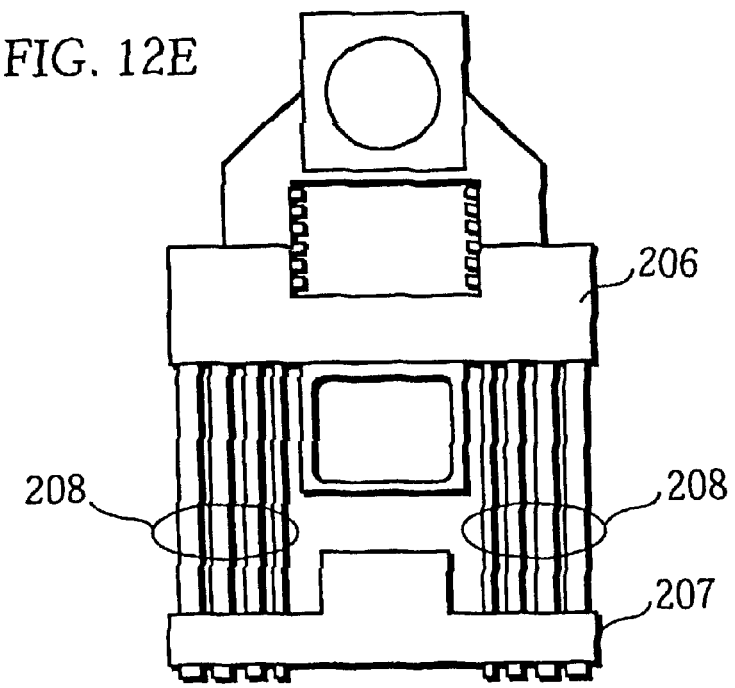

As shown in FIG. 12D, surfaces of the portions 218a–218b and 219a–219b, which form a terminal area "T" of the optical pickup body, are all in the same vertical position because the terminal portions 218a–218b of the first metal plate 218 have been raised to the predetermined height.

Following this, unnecessary portions around the movable enclosure 206 and the fixed member 207 and unnecessary parts of the terminal portions 218a–218b and 219a–219b are cut, so that each of the supporting members 208 can be electrically insulated to be used as conductors.

When the movable enclosure 206 and the fixed member 207 are simultaneously molded out of resins in this way, with the supporting members 208 being sandwiched between the molds of the movable enclosure 206 and the fixed member 207, it becomes possible to make a supporting length the same for all the supporting members 208 and therefore a uniform stress can be given to each supporting member 209. This prevents abnormal resonance from being generated and stabilizes operations of the optical pickup 200. In addition, with the above manufacturing method, the supporting members 208 can be handled either than when they are generated from wires, and greatly reduce their production cost.

For the present optical pickup 200, optical components such as the objective lens 206, the semiconductor laser, and the photodetector are positioned into the movable enclosure 206, so that their positional relationship can be always the same. As a result, degradation of optical properties of the present optical pickup 200 due to lens aberration or the like can be prevented when the optical pickup 200 follows a track of the recording medium 212. In addition, abnormal resonance that affect a read by the optical pickup 200 can be prevented as the movable enclosure 208 is connected to the fixed member 207 via the supporting members 208 which have different widths and different elastic coefficients, which can reduce a resonance factor for a certain resonance frequency.

In the above embodiment, the insert molding process is performed for connecting the supporting members 208 to both the movable enclosure 206 and the fixed member 207. However, it is alternatively possible to perform a soldering process, or use UV resins or melted glass, in order to connect the supporting members 208 to either the movable enclosure 206 or the fixed member 207.

Fourth Embodiment

Figure 13:
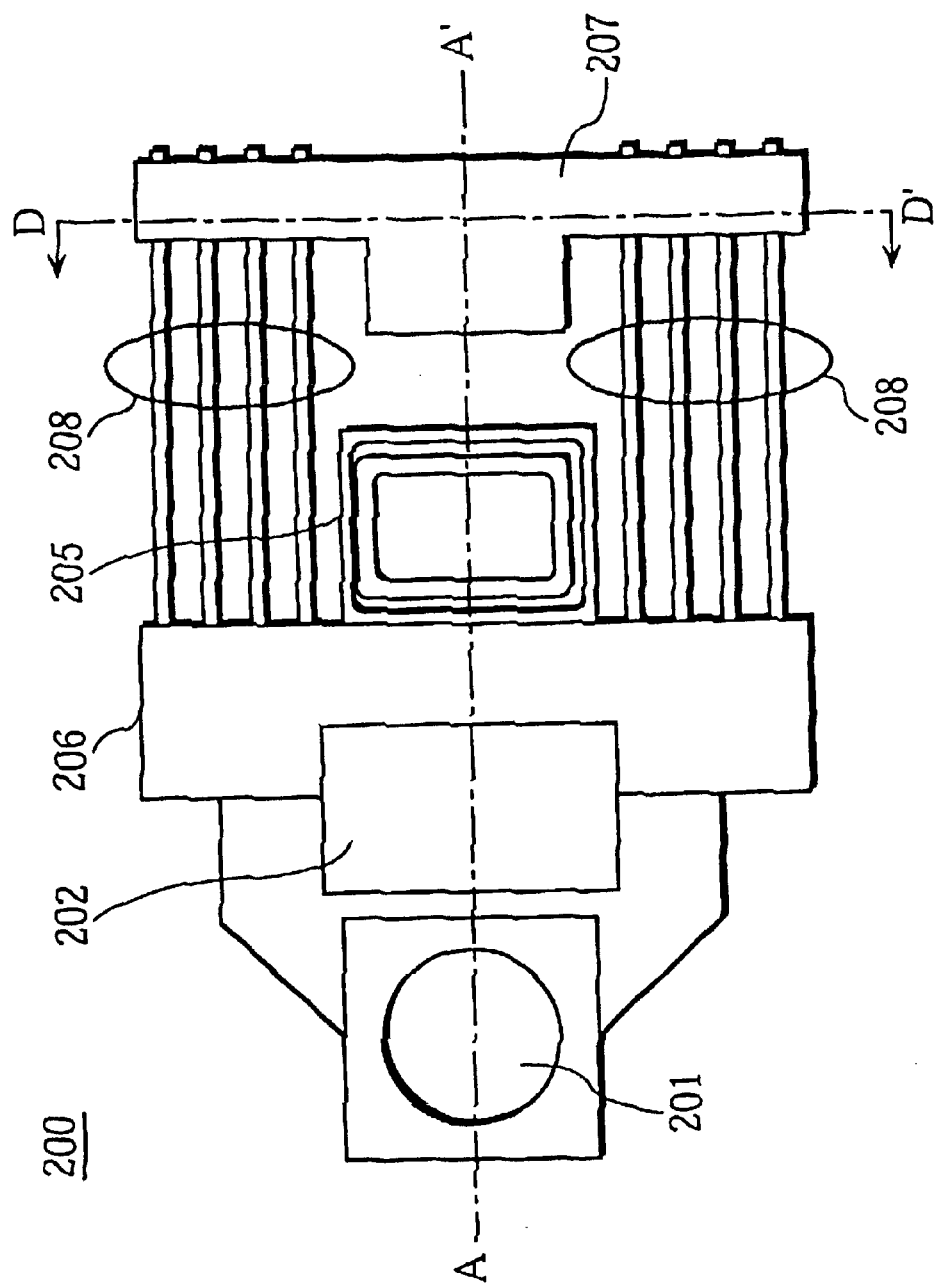
FIG. 13 is a plan view of an optical pickup of the fourth embodiment.

FIG. 13 is a plan view of an optical pickup 200 of the fourth embodiment of the present invention. The present optical pickup 200 differs from the optical pickup of the third embodiment in that the present supporting members 208 have the same width and in that the present fixed member 207 has a unique construction to hold each supporting member 208.

Figure 14:
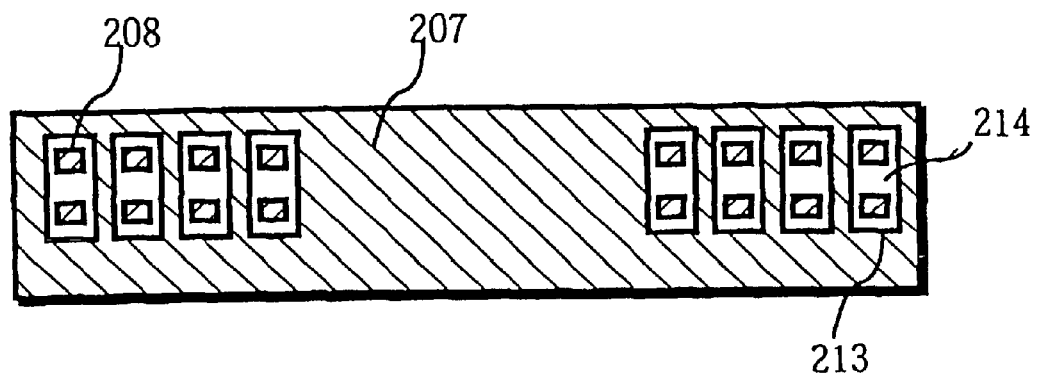
FIG. 14 shows a state of concaves in a fixed member of the optical pickup in FIG. 13 in vertical section view.

FIG. 14 is a vertical section view, which is obtained by cutting the fixed member 207 along a line D–D' in FIG. 13. As shown in the figure, eight concaves 213 are provided inside the fixed member 207 and each concave encloses base portions of two supporting members 208 composed of an upper member and a lower member. Four types of damping materials 214, which are gel and have different viscoelasticities, are each filled into two out of the eight concaves 213 that exist symmetrically with respect to a line A–A'. This allows the supporting members 208 to have different resonance frequencies.

Figure 15:
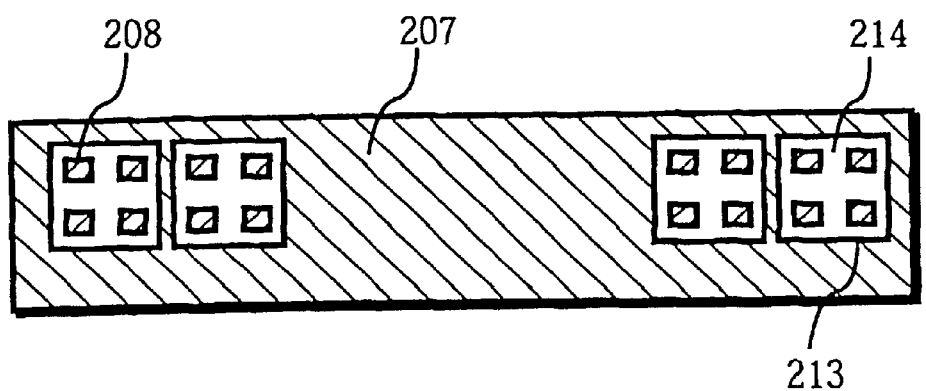
FIG. 15 shows another state of concaves in a fixed member of the optical pickup in FIG. 13 in vertical section view.

As shown in FIG. 15, it is alternatively possible to provide four concaves 213 that each enclose four supporting members 208 and fill two types of gel damping materials 214 that have different viscoelasticities into the four concaves 213 so as to have a type of the damping material 214 to be filled into each concave 213 differ symmetrically with respect to the center line A–A', although in the case of FIG. 14, the damping materials 214 of four types are filled into the eight concaves 213.

The total number of types of damping materials, and the number of supporting members 208 to which a damping material 214 of the same type is applied may vary, depending on the total number of the supporting members 208.

In the present embodiment, a UV-hardening silicon gel material is used as the damping materials 214, and beryllium copper is used for the supporting members 208. The supporting members 208, however, may be made of phosphor bronze, or titanium copper, instead.

Each supporting member 208 is insulated, and used as a power-supplying line and a signal line for the semiconductor laser and the photodetector.

For the present optical pickup 200, each optical component is positioned into the movable enclosure 206, and therefore stable optical properties can be obtained as in the third embodiment. At the same time, the present optical pickup 200 can perform an optical read/write with an increased precision as its supporting members 208 have different resonance frequencies to suppress unnecessary resonance.

Fifth Embodiment

Figure 16:
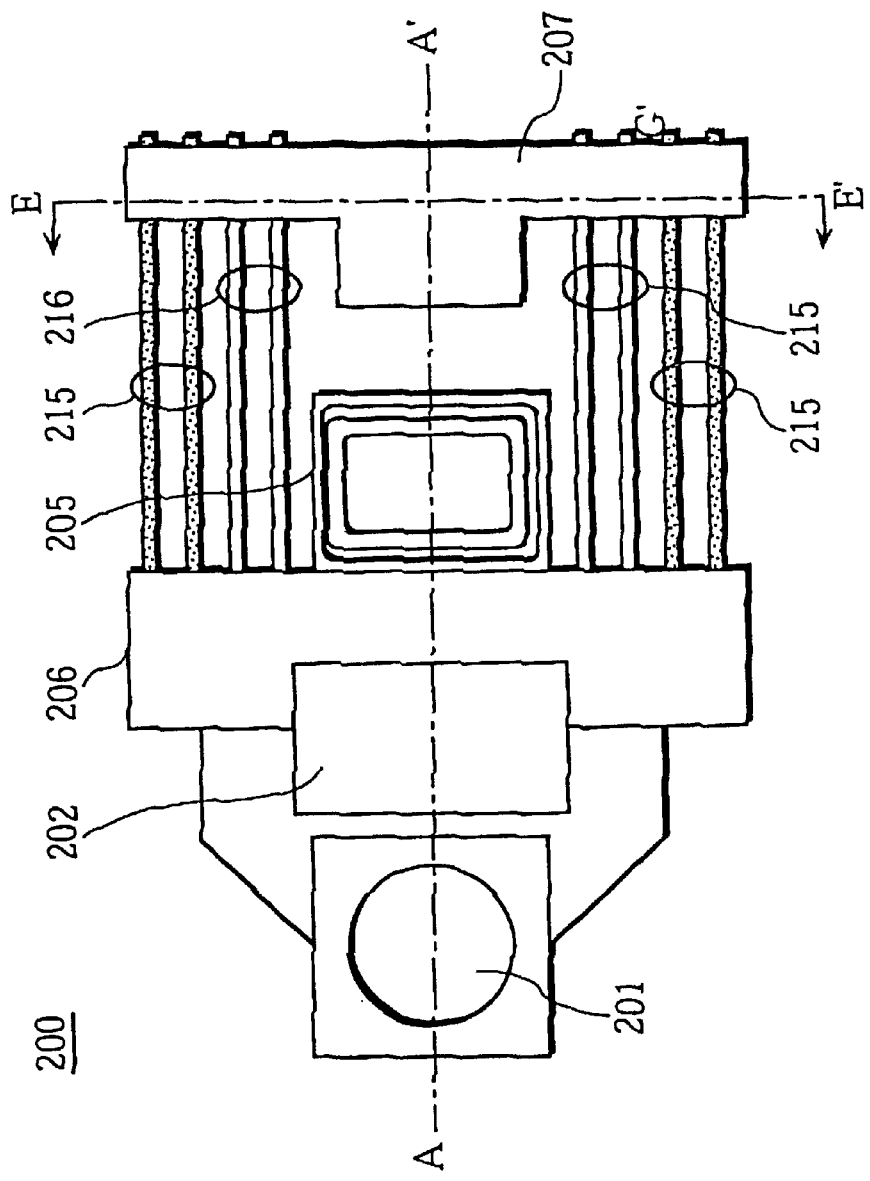
FIG. 16 shows a construction of an optical pickup of the fifth embodiment in plan view.

FIG. 16 shows a construction of an optical pickup 200 of the fifth embodiment of the present invention in plan view. The present optical pickup 200 differs from the optical pickup of the third embodiment in that the supporting members of the present embodiment have a uniform width and in that two types of materials are used as these supporting members. More specifically, beryllium copper is used as first supporting members 215, and phosphor bronze is used as second supporting members 216. The first supporting members 215 consist of eight supporting members (two upper members and two lower members on each side of a center line A–A') positioned farther from the center line A–A' in FIG. 16, and the second supporting members 216 consist of eight supporting members positioned closer to this center line A–A'. Since the first and the second supporting members 205 and 206 are made of different materials, different resonance frequencies can be given to the first and the second supporting members 205 and 206. This can reduce a resonance factor for a certain frequency, and therefore suppress abnormal resonance that affect optical properties of the optical pickup 200. The number of the supporting members in total, the number of the first supporting members 215, and the number of the second supporting members 215 are not limited to the above, and other numbers may be alternatively set for these supporting numbers.

Each of the first and second supporting members 215 and 216 is insulated from one another, and used as power-supplying lines and as signal lines for the semiconductor laser and the photodetector.

Figure 17:
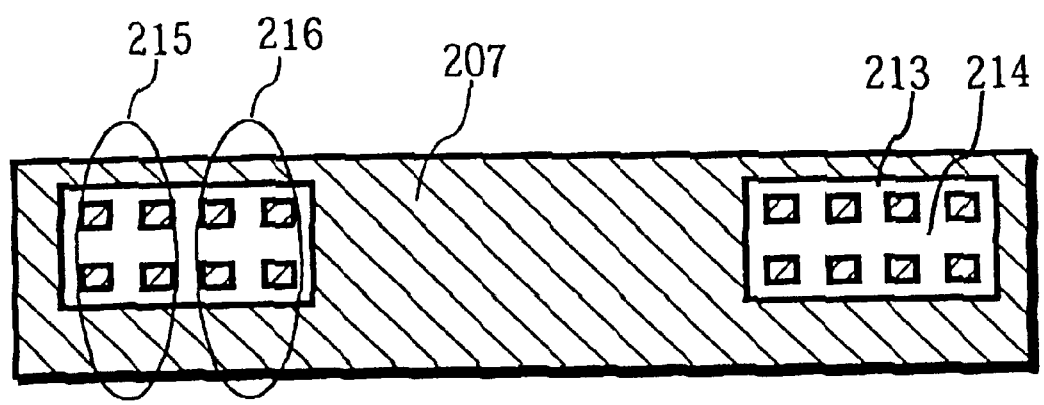
FIG. 17 shows a state of concaves in a fixed member of the optical pickup of the fifth embodiment in vertical section view.

FIG. 17 is a vertical section view, which is obtained by cutting the fixed member 207 along a line E–E' in FIG. 16. In a similar way to the third embodiment, two concaves 213 are provided inside the fixed member 207, and base portions of four of the first and second supporting members 215 and 216 are present in each concave 213. A damping material 214, which is a UV-hardening silicon gel having viscoelasticity, is filled into the two concaves 213 to absorb vibrations generated by the first and second supporting members 215 and 216 and suppress resonance.

As in the third and fourth embodiments, the optical pickup 200 of the present embodiment also has stable optical properties as optical components are collectively positioned into the movable enclosure 206, and can perform an optical read with an increased precision as its supporting members 215 and 216 have different resonance frequencies to suppress unnecessary resonance.

Sixth Embodiment

The present embodiment and the subsequent embodiment are unique in that each supporting member is composed of layers of different materials although in the above first to fifth embodiments, a supporting member is made of a single material.

Figure 18:
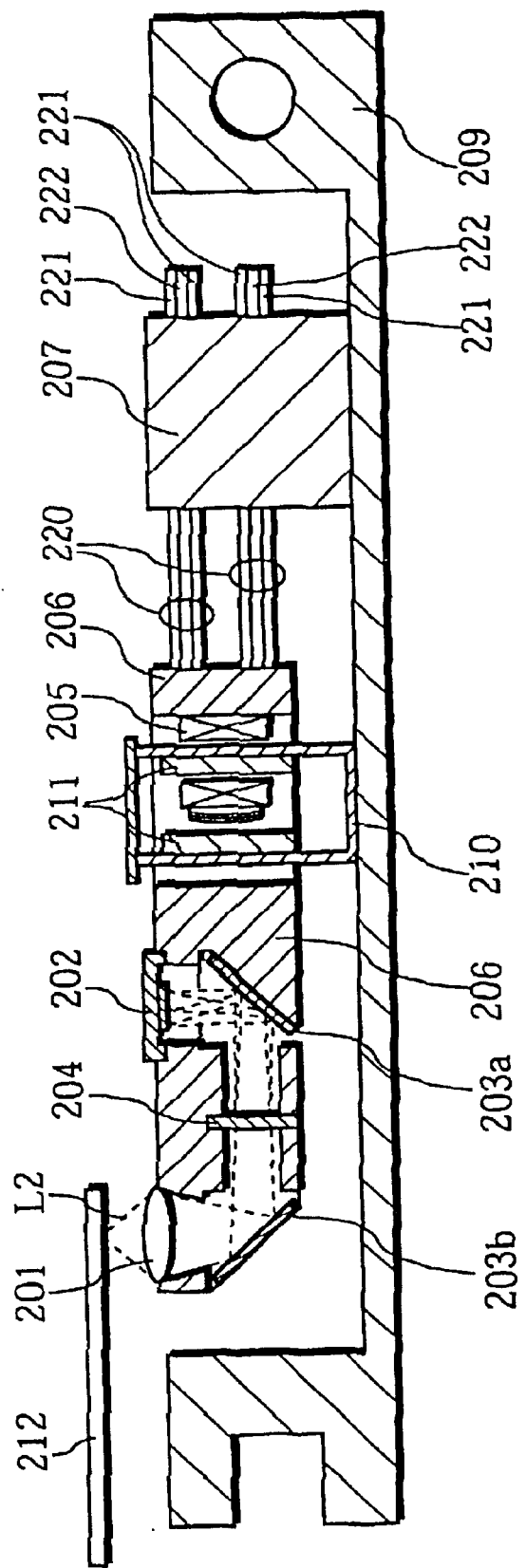
FIG. 18 shows a construction of an optical pickup of the sixth embodiment in vertical section view.
Figure 19:
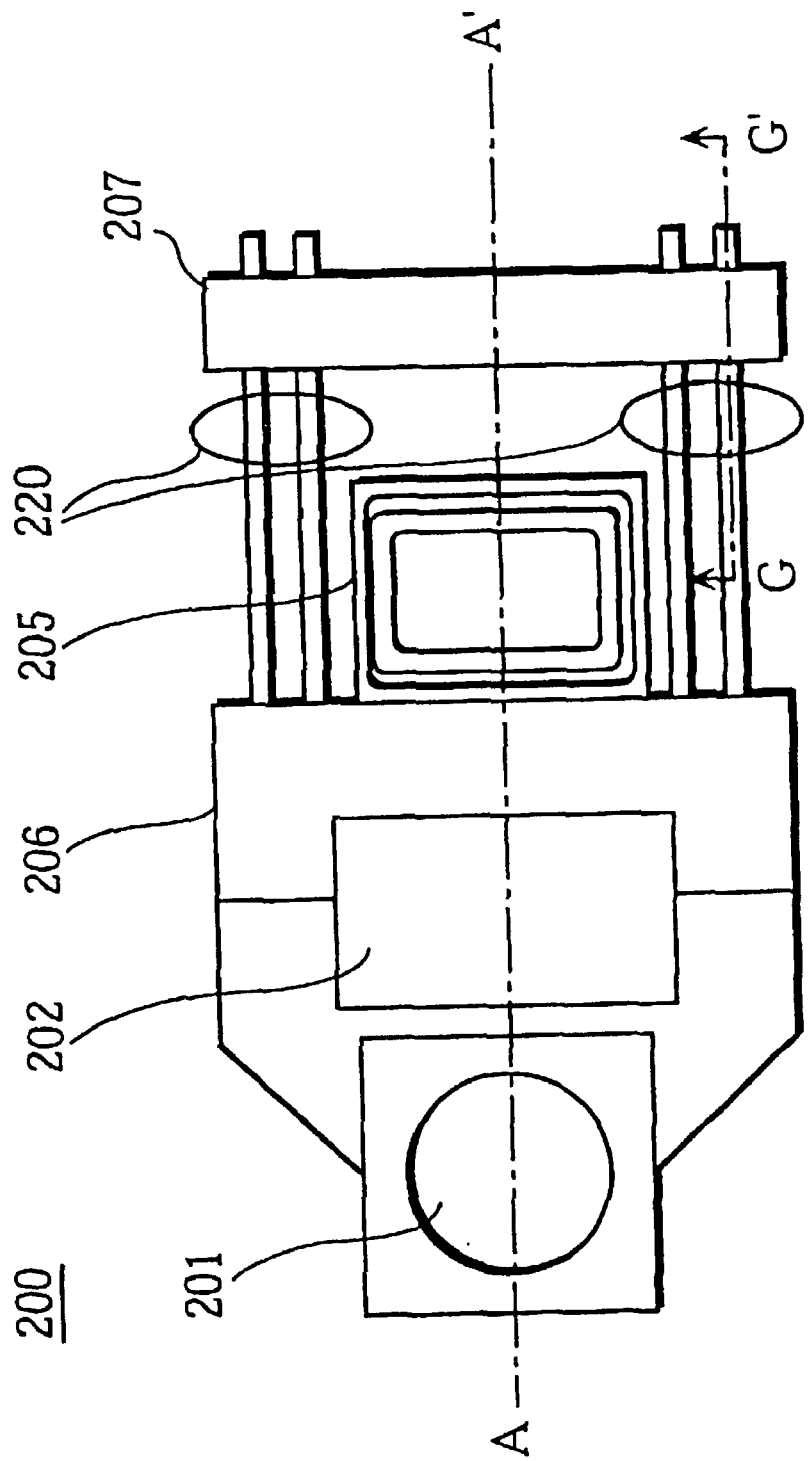
FIG. 19 is a plan view of the optical pickup in FIG. 18.

FIG. 18 shows a construction of an optical pickup 200 of the present embodiment in vertical section view, and FIG. 19 is a plan view of the optical pickup 200. As shown in the figure, a movable enclosure 206 is supported by a fixed member 207 via eight supporting members 220, which are positioned symmetrically with respect to a center line A–A' in FIG. 19, with four of them being positioned on the right and the other four on the left of the center line A–A'. Each supporting member 220 has a layered construction as shown in FIG. 20.

Figure 20:
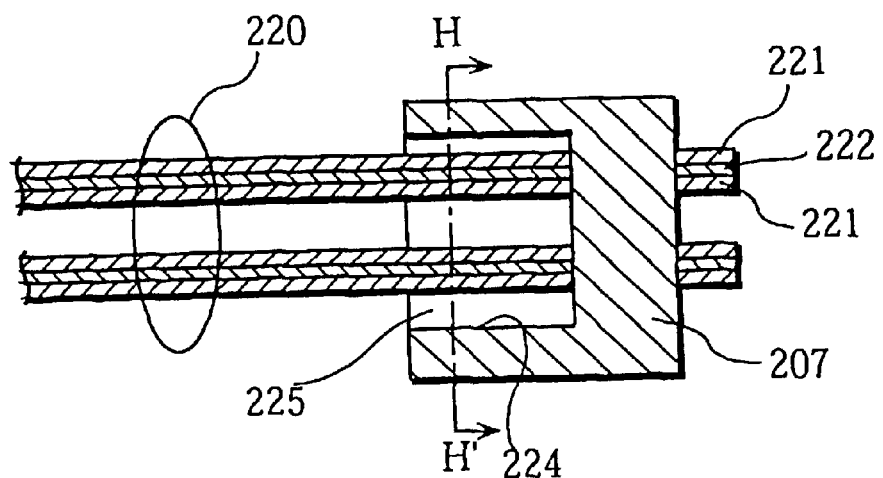
FIG. 20 is a vertical section view obtained by cutting a fixed member of the optical pickup in FIG. 19 along a line G–G'.

FIG. 20 is a vertical section view, which is obtained by cutting the fixed member 207 along a line G–G'. Each supporting member 220 has a layered construction composed of two metal members 221 and one insulating member 222, with the insulating member 222 between the metal members 221. Each metal member 221 is made of either phosphor bronze, beryllium copper, titanium copper, or the like, and is electrically insulated to be used as power-supplying lines and as signal lines for the semiconductor laser and the photodetector.

Figure 21:
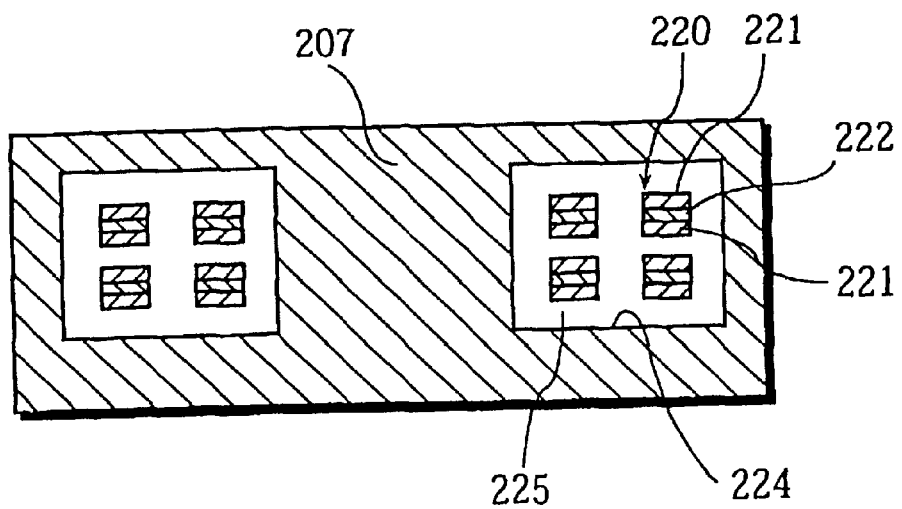
FIG. 21 is a vertical section view obtained by cutting along a line H–H' in FIG. 19.

As shown in FIG. 20, base portions of each supporting member 220 is embedded and fixed into the fixed member 207, which has two concaves 224 (see FIG. 21). A damping material 225, which is a UV-hardening silicon gel material having viscoelasticities as in the above embodiments, is filled into the two concaves 224 to enclose and fasten base portions of four supporting members 220 and absorb a vibration generated by each supporting member 220.

FIG. 21 is a vertical section view obtained by cutting along a line H–H' in FIG. 19. As shown in the figure, the fixed member 207 has the two concaves 224, and four supporting members 220 are present in each concave 224.

The present optical pickup 200 also has a construction of the optical-component-integrated type, so that the same positional relationship is maintained between an objective lens 201, and other optical components such as a semiconductor laser, a photodetector, and a mirror. This can prevent degradation in optical properties due to lens aberration which is generated when the optical pickup 200 follows a track of the recording medium 212.

In addition, the number of the supporting members 220 can be reduced since each of them includes two metal members 221 which are electrically insulated by the insulating member 222, and the two metal members 221 can be used as power-supplying lines and signal lines for the semiconductor laser and the photodetector. As a single supporting member 208 can be used as two lines in this way, a size of the whole optical pickup 200 can be reduced. It should be clear that the number of such lines can be increased by increasing the number of layers of metal members and insulating members contained in each supporting member 220.

When the stated gel damping material is used as the insulating members 222, unnecessary vibrations generated by each supporting member 220 can be absorbed by these insulating members 222, and therefore generation of unnecessary resonance can be minimized.

For the present optical pickup 200 also the insert molding process may be performed by sandwiching predetermined portions of the supporting members 220 between molds of the movable enclosure 206 and the fixed member 207. This not only allows the supporting members 220 to have a uniform supporting length and to be given a uniform stress, but also minimizes variations in assembled optical pickups.

In the present embodiment, each supporting member 220 has substantially the same resonance frequency as each of them is of the same size and is made of the same combination of materials. The aforementioned use of the damping material as insulating members 222 suppresses resonance to some extent, but not completely. Accordingly, it is desirable to make each supporting member 220 have a different resonance frequency using certain methods, regardless of the above use of the damping material as insulating members 222.

A variety of methods can be used to achieve this, but the present embodiment describes the following four methods as example modifications: (1) providing different widths to the supporting members 202; (2) providing cross sectional areas of different sizes to the supporting members 202; (3) use of different damping materials applied to the supporting members 220; and (4) use of different materials for different supporting members 220.

Figure 22:
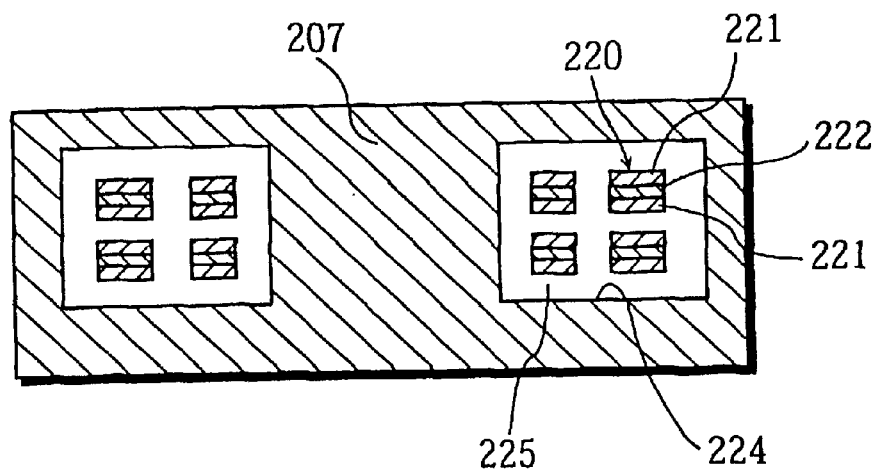
FIG. 22 shows vertical sections of concaves and supporting members in a fixed member of the optical pickup of the sixth embodiment as a modification example.
Figure 23:
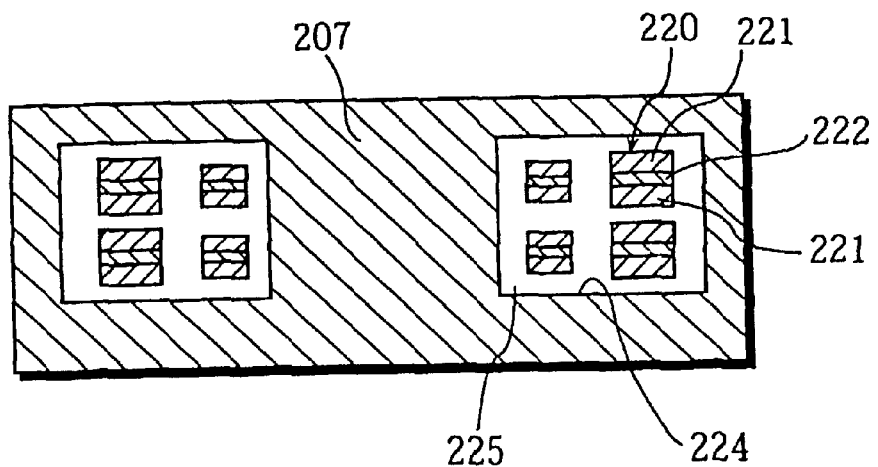
FIG. 23 shows vertical sections of concaves and supporting members in a fixed member of the optical pickup of the sixth embodiment as another modification example.
Figure 24:
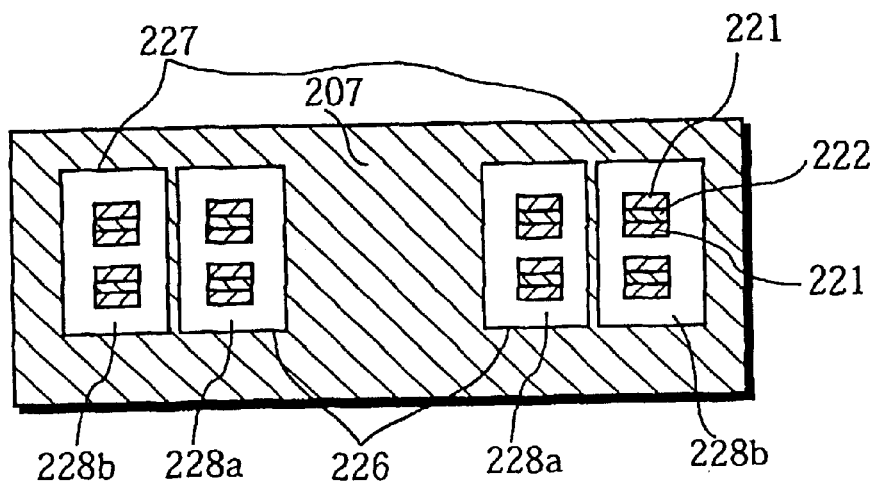
FIG. 24 shows vertical sections of concaves and supporting members in a fixed member of the optical pickup of the sixth embodiment as another modification example.

FIGS. 22–24 are vertical section views obtained by cutting the fixed member 207 along the line G–G' in FIG. 19 for each modification example.

(1) Providing a Different Width

As shown in FIG. 22, supporting members 202, which can be divided into two types according to their widths, are positioned symmetrically with respect to the center line A–A' of the optical pickup 200 shown in FIG. 19. As a result, at least two resonance frequencies can be given to the eight supporting members 220. In the figure, four supporting members 220 closer to the center have a narrower width than other four members 220 farther from the center. However, it is alternatively possible to position supporting members 220 of a narrower width farther from the center. Note that when the total number of the supporting members 220 is higher than eight, these supporting members 220 may be positioned according to their widths in a manner other than the above.

(2) Providing a Cross Sectional Area of a Different Size

As shown in FIG. 23, two types of section areas, which are similar figures of a different size, are provided to the supporting members 208. These supporting members 208 of the two types are positioned symmetrically with respect to the center line A–A' of the optical pickup 200. As a result, different resonance frequencies can be given to the eight supporting members 220.

(3) Use of Different Damping Materials

As shown in FIG. 24, four concaves 226 and 227 are provided inside the fixed member 207, with two upper and lower supporting members being present in each concave. Two types of damping materials 228a and 228b which have different elasticities are filled into the concaves 226 closer to the center line A–A' and into the concaves 227 farther from the center line A–A', respectively.

(4) Use of Different Materials as Supporting Members

The same damping material is filled into all the concaves 226 and 227 in FIG. 24, but a material of the metal member 221 and/or that of the insulating member 222 may differ between: (a) four supporting members 220 closer to the center line A–A'; and (b) other four supporting members 220 farther from the center line A–A'. As a result, different resonance frequencies can be given to the four inner supporting members 220 and the other four supporting members 220 farther from the center line A–A'.

In this way, due to the above constructions, a different resonance frequency can be given to each of:(a) four inner supporting members 220 closer to the center; and (b) four outer supporting members 220 farther from the center. This reduces a resonance factor for a certain frequency, and therefore effectively prevents degradation in precision with which the optical pickup 200 performs a read and a write.

Seventh Embodiment

The optical pickup 200 of the present embodiment differs from that of the sixth embodiment in a shape and a layered construction of supporting members. More specifically, supporting members of the present embodiment has a layered construction in which different materials are layered concentrically, although in the sixth embodiment, different materials are layered only in one direction.

Figure 25:
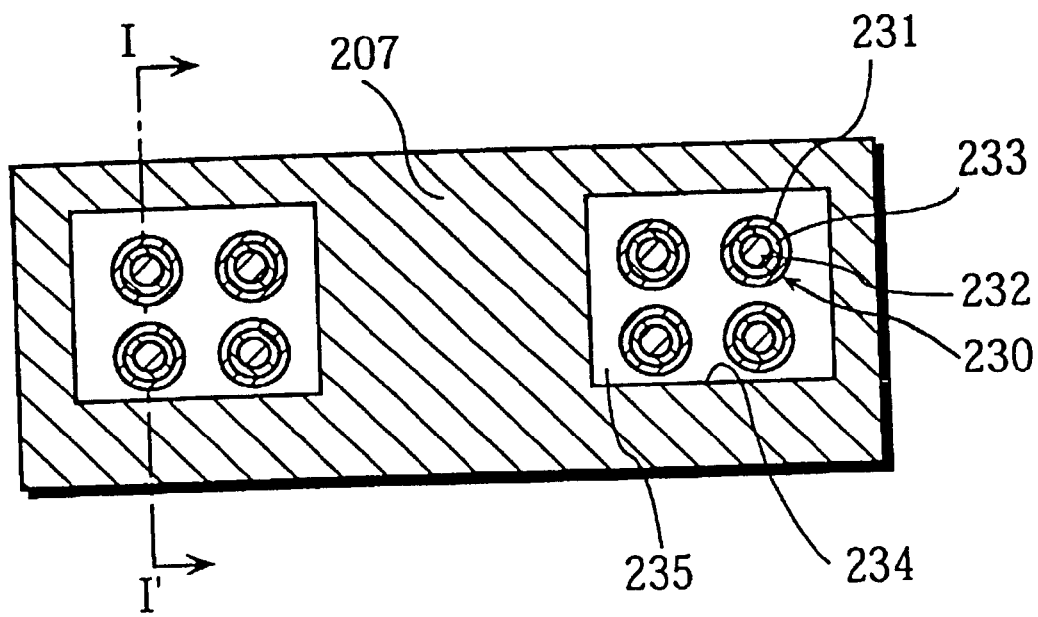
FIG. 25 shows vertical sections of concaves and supporting members in a fixed member of an optical pickup of the seventh embodiment.

FIG. 25 shows base portions of the supporting members 230 in cross section view, which is obtained by cutting the same position as when the cross section of FIG. 21 is obtained in the sixth embodiment.

As shown in the figure, each supporting member 230 is shaped like a cylinder, and composed of a metal pipe 231, an insulating material 233 of a cylindrical shape, and a metal core 232. The metal pipe 231 encloses the metal core 232, and the insulating material 233 is inserted between the metal pipe 231 and the metal core 232.

Figure 26:
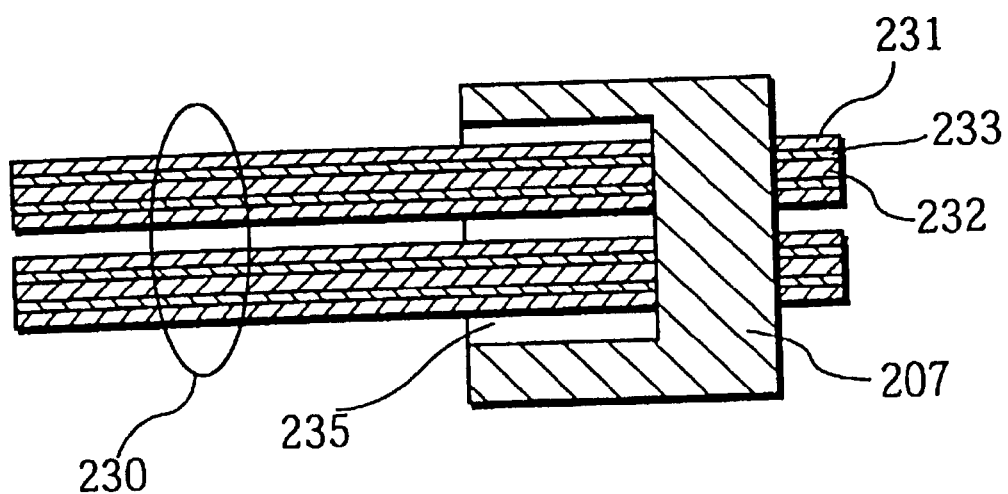
FIG. 26 is a vertical section view, which is obtained when a construction shown in FIG. 25 is cut along a line I–I'.

FIG. 26 is a vertical section view, which is obtained when the construction shown in FIG. 25 is cut along a line I–I'. Base portions of the supporting members 230 are embedded and fixed into the fixed member 207, and a concave 234 exists next to the embedded base portions. A damping material 235 is filled into the concave 234 to absorb a vibration of each supporting member 230.

When a damping material is used as the insulating materials 233, they can absorb not only vertical and horizontal vibrations as in the sixth embodiment, but also vibrations in every other direction due to the layered construction of the present supporting members 230, in which different materials are concentrically layered. In addition, these supporting members 230 can be used as sixteen signal lines and power-supplying lines by having each supporting member 230 electrically insulated. It should be clear that the number of such lines further increases if the number of layers of the metal pipes and the insulating materials that make up each supporting member 230 are increased.

Note that it is possible in the present embodiment also, to use supporting members that are different in their diameters or in materials, and to position these supporting members of different types symmetrically with respect to the center line of the fixed member 207. Alternatively, damping materials of different types may be filled into the concaves 234 symmetrically with respect to the center of the fixed member. This makes a resonance frequency differ between: (a) four inner supporting members 230 closer to the center; and (b) four outer supporting members 230 farther from the center, and therefore can reduce a resonance factor for a certain frequency. Accordingly, it becomes possible to effectively prevent degradation in precision with which the optical pickup 200 performs a write and a read.

Eighth Embodiment

Figure 27:
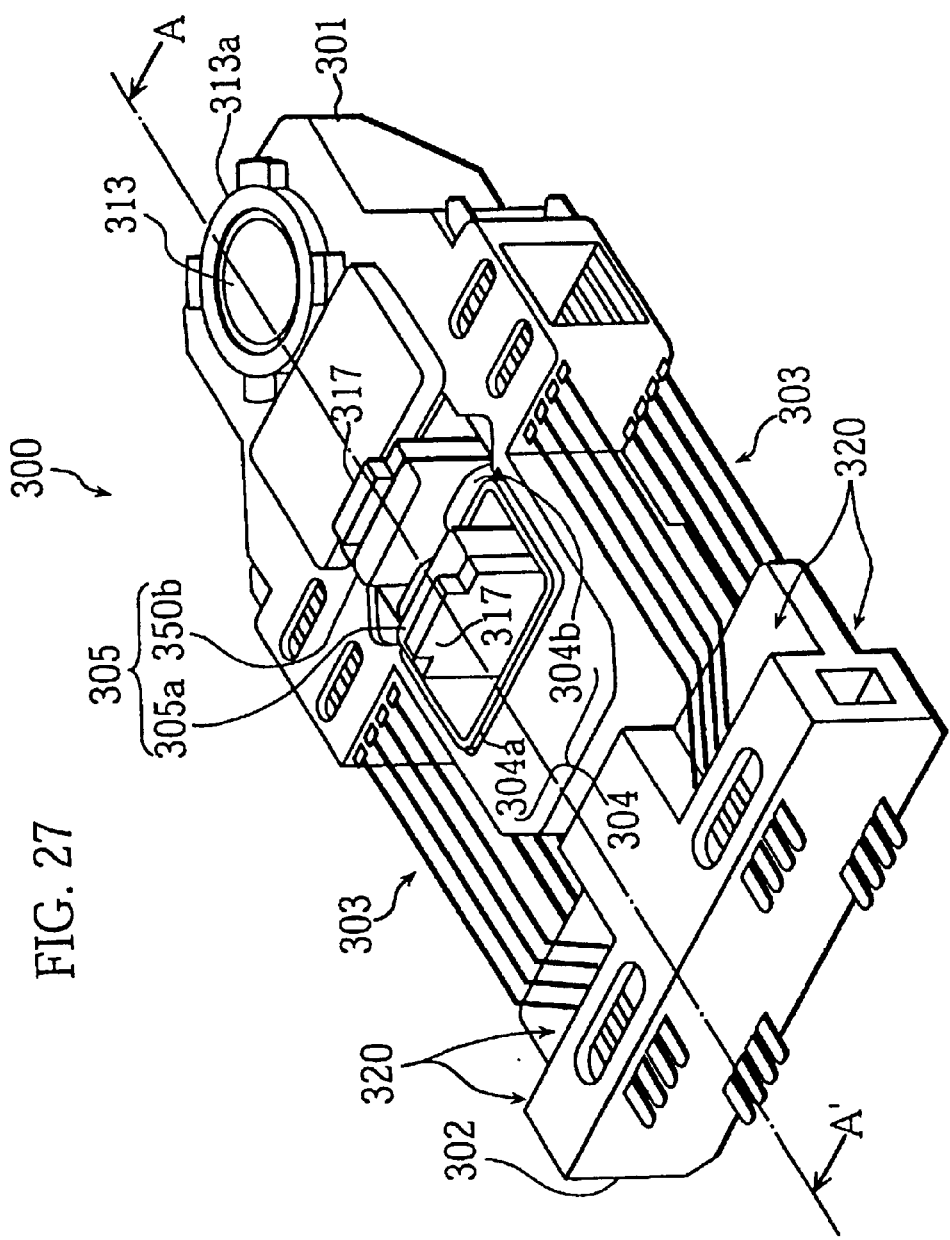
FIG. 27 shows a construction of an optical pick of the eighth embodiment in perspective view.

FIG. 27 shows a construction of an optical pick 300 of the present embodiment in perspective view. The present optical pickup 300 includes the following: a movable enclosure 301, which is movable and carries an objective lens 313 and a light emitting/receiving component substrate (not shown in the figure) onto which a semiconductor laser and a photodetector are integrated; a fixed member 302 that is fixed to an optical base (not shown in the figure); and sixteen elastic supporting members 303, which are electrically conductive and connect the movable enclosure 301 with the fixed member 302 in a manner that allows the movable enclosure 301 to move.

Driving coils 304 are positioned into the movable enclosure 301. The driving coils 304 consist of a focusing coil 304a that moves the movable enclosure 301 in the focusing direction, and of a tracking coil 304b that moves the movable enclosure 301 in the tracking direction.

Two magnets 305a and 305b are positioned inside a yoke 317 in a manner that their opposite magnetic poles face each other. Hereafter, the two magnets 305a and 305b are collectively called magnets 305. Together with the driving coils 304, the magnets 305 form a magnetic circuit for generating magnetic force in the focusing direction and the tracking direction. The yoke 317 is fixed onto the optical base.

In this specification, a direction that is perpendicular to both the tracking direction and the focusing direction is called a "fore/aft direction". For the present optical pickup 300, a position of supporting points at which the sixteen supporting members 303 support the movable enclosure 301 are placed in almost the same position as, in this fore/aft direction, where a power point at which a magnetic force is exerted to the driving coil 304. At the same time, the center of the gravity of the movable enclosure 301 in the fore/aft direction is placed in almost the same position where the above supporting points exist. These position adjustments are performed, for instance, by making adjustments to component shapes and by loading weights into the optical pickup 300. The sixteen wires 303 are insulated from one another, and their ends on the side of the movable enclosure 301 are electrically connected to the semiconductor laser and the photodetector on the light emitting/receiving component substrate, and the driving coils 304 while other ends on the side of the fixed member 302 are connected to a signal processing circuit (not shown in the figure).

Figure 28:
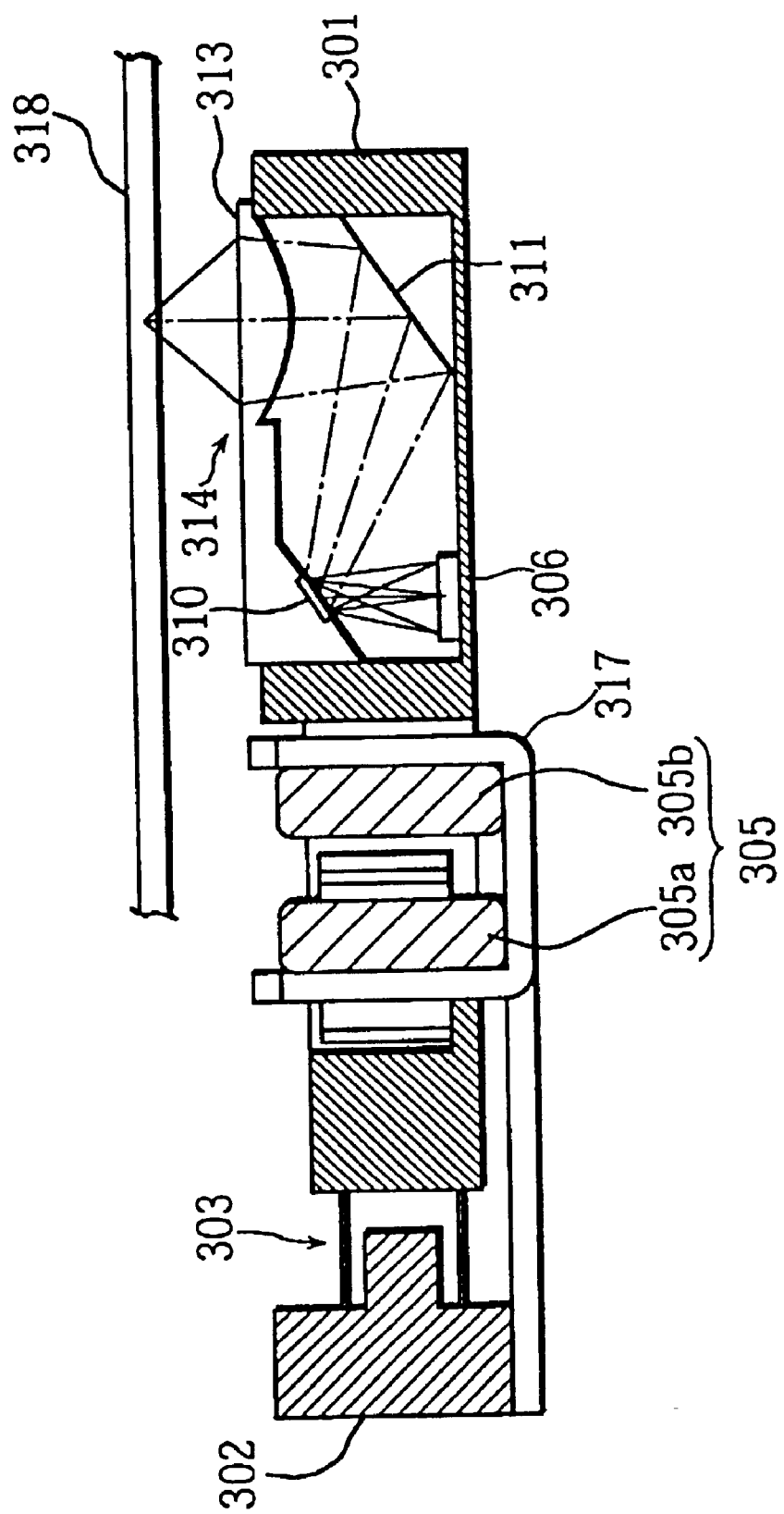
FIG. 28 shows vertical sections obtained by vertically cutting the optical pickup in FIG. 27 along a line A–A'.

The following describes an internal construction of the movable enclosure 301. FIG. 28 shows a simplified internal construction in vertical section view obtained by vertically cutting the present optical pickup 300 along the line A–A' in FIG. 27. As shown in the figure, the movable enclosure 301 contains the light emitting/receiving component substrate 306, onto which the semiconductor laser and the photodetector are integrated. A first reflecting surface 310 is positioned in an optical path of a laser beam emitted by the semiconductor laser. The first reflecting surface 310 has a reflecting hologram region 308, which is formed through etching or a resin molding process. The first reflecting surface 310 and the objective lens 313 are integrally molded as an objective-lens/hologram component 314, which is molded out of transparent materials such as resins and is fitted into the movable enclosure 301.

Optical components are positioned and fixed inside the movable enclosure 301 so as to move a laser beam emitted by the semiconductor laser as follows. A second reflecting surface 311 is positioned in parallel to the first reflecting surface 310 and in an optical path of the laser beam reflected by the first reflecting surface 310. The beam reflected by the second reflecting surface 311 is focused by the objective lens 313 on an optical recording medium 318.

With respect to the optical recording medium 318, the objective lens 313 has a focal distance that is suitable for its numerical aperture (NA) required for a playback of the optical recording medium 318. With the present optical pickup 300, the reliability of the optical system can be obtained as the light emitting/sending component substrate 306 is inside the movable enclosure 301, which is sealed by the objective-lens/hologram component 314.

The following describes operations of the optical pickup 300.

The semiconductor laser in the movable enclosure 301 emits a laser beam, which is first reflected by the first reflecting surface 310 and then by the second reflecting surface 311 so that the beam enters into the objective lens 313. As the first reflecting surface 310 is in parallel to the 313, the principal ray of the laser beam emitted by the semiconductor laser becomes parallel to that of the laser beam entered into the objective lens 313. A width of the laser beam is enlarged in accordance with the length of the optical path of this laser beam between the first reflecting surface 310 and the second reflecting surface 311.

This beam whose width has been enlarged enters into the objective lens 313, and is focused onto the recording layer of the optical recording medium 318.

This beam is reflected by the optical recording medium 318 so that a return beam passes through the objective lens 313 again, and is reflected by the second reflecting surface 311, and reflected and diffracted by the reflecting hologram region formed on the first reflecting surface 310. The diffracted return beam is focused on the photodetector on the light emitting/receiving component substrate 306, and the return beam is detected as a focusing error detection signal, a tracking error detection signal, and an information recorded signal.

Figure 29:
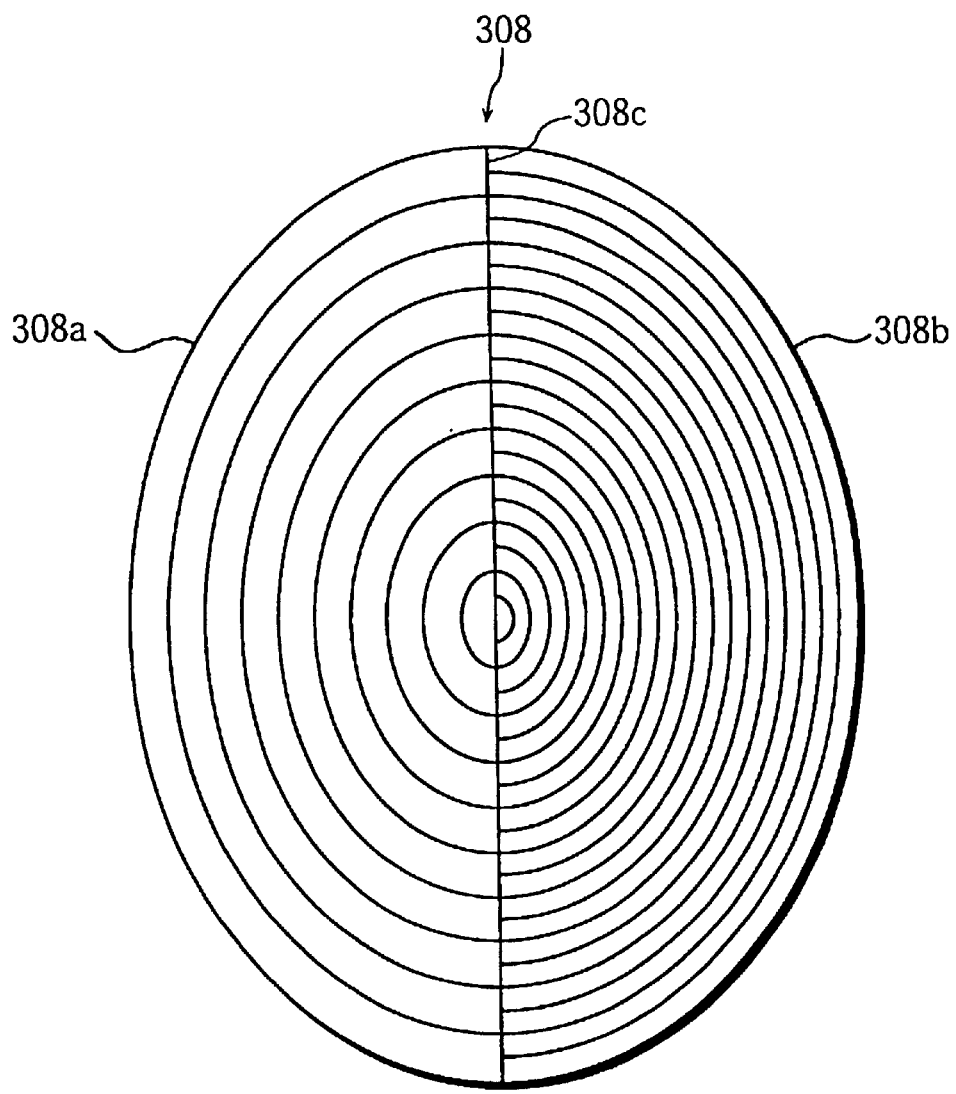
FIG. 29 shows a reflecting hologram region formed in a reflecting surface installed inside the optical pickup of the eight embodiment.

FIG. 29 shows this reflecting hologram region 308. As shown in the figure, the reflecting hologram region 308 is divided by a dividing line 308c that is substantially parallel to tracks of the optical recording medium 318 into two hologram subregions 308a and 308b which reflect and diffract the return beam. The reflecting hologram region 308 has a wavefront converting function (i.e., lens effect) so as to provide a different focal distance to a positive first-order diffracted light and a negative first-order diffracted light which are diffracted by the same hologram subregion. The reflecting hologram region 308 also has a curve pattern which is determined in consideration of incident angle dependency when the beam is reflected. The hologram subregions 308a and 308b have diffraction gratings whose pitches are different so as to provide a different diffraction angle between the subregions 308a and 308b.

Figure 30:
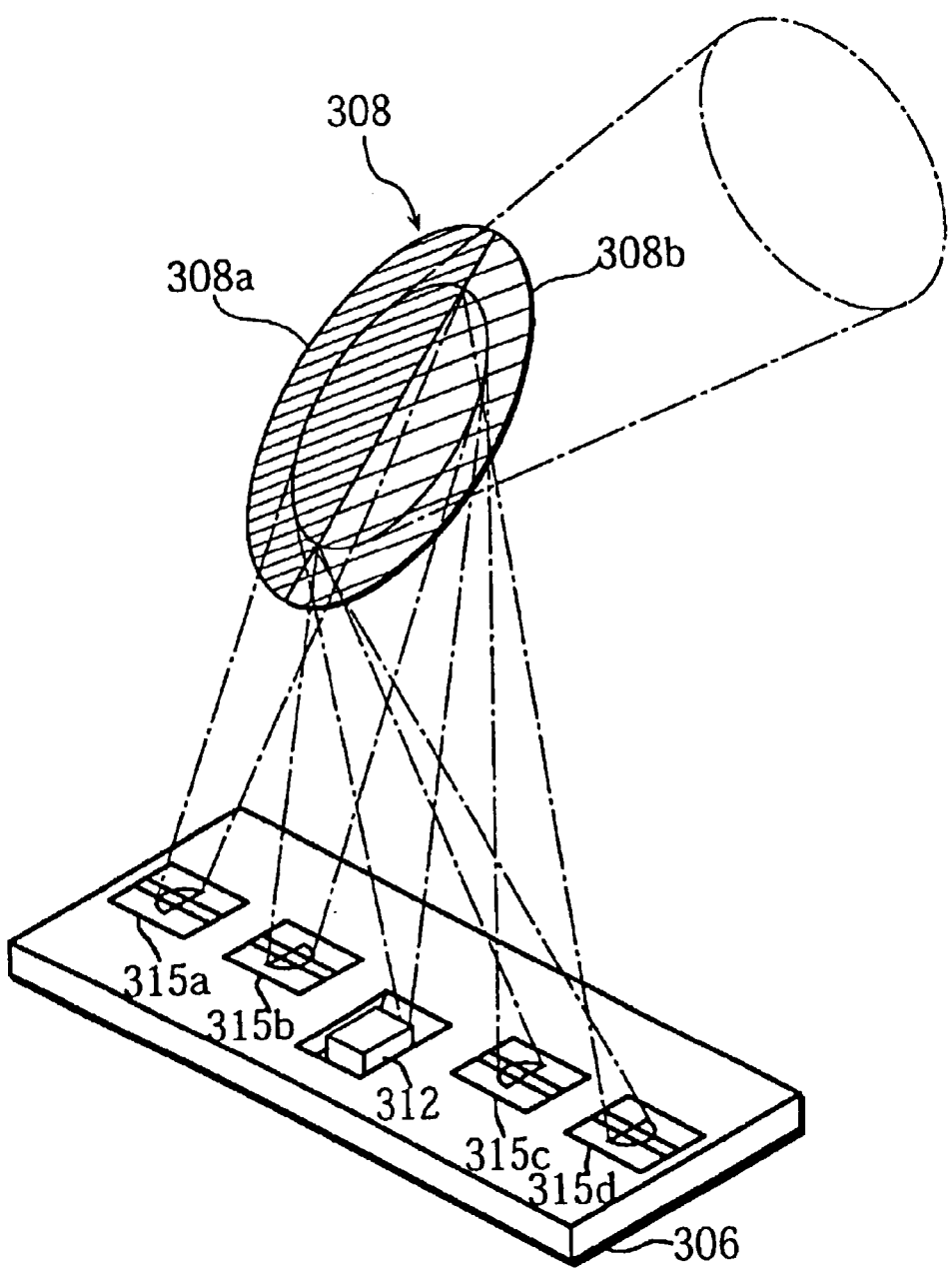
FIG. 30 shows a construction of a light emitting/receiving substrate positioned inside the optical pickup in FIG. 29.

FIG. 30 shows a construction of the light emitting/receiving substrate 306 in perspective view. The semiconductor laser 312 and a photodetector substrate 315 are positioned onto the light emitting/receiving substrate 306. Three-part split photodetectors 315a–315d are provided onto the photodetector substrate 315 so that positive first-order diffracted lights and negative first-order diffracted lights, which have been diffracted by the hologram subregions 308a and 308b, are focused onto these photodetectors 315a–315d. Detection of the focusing error is performed using the photodetectors 315a–315d according to the Spot Size Detection method, with which changes in spot diameters of the positive and negative first-order diffracted lights are detected. Detection of the tracking error is performed according to the Push-Pull method, with which differentials of values obtained at the photodetectors 315a–315d are used.

A current is supplied to the focusing coil 304a in accordance with the focusing error detected by the photodetectors 315a–315d on the photodetector substrate 315 so that the focusing coil 304a positioned in a magnetic circuit is driven, and moves the movable enclosure 301 in a direction of an optical axis of the objective lens 313. In this way, the optical pickup 300 performs focusing servo, that is, focusing the laser beam onto the recording layer of the optical recoding medium 318. After this, a current is supplied to the tracking coil 304b in accordance with the tracking error which has been obtained based on results of light reception by the photodetectors 315a–315d. A magnetic driving force is then exerted to the tracking coil 304b, which then moves the movable enclosure 301 in the tracking direction. In this way, the optical pickup 300 performs tracking servo, that is, repositions the laser beam on a track, from which data should be read. After this, the photodetectors 315a–315d detect an information recorded signal.

The present embodiment states that the optical pickup 300 has the sixteen elastic supporting members 303 which are electrically conductive. However, the number of the elastic supporting members 303 do not have to be sixteen, and may be a different number which may be determined in accordance with a necessary number of signal lines. Also, it is not necessary to use all the elastic supporting members 303 as the power-supplying lines and signal lines. However, it should be clear that the present optical pickup 300 has the elastic supporting members 303 whose number is large enough to absorb external perturbations so as to suppress external perturbations. Also, the number of the elastic supporting members 303 should be preferably an even number or an integral multiple of four, and the supporting members 303 of the same number should be disposed symmetrically with respect to a center line, which is present in the vertical direction or the horizontal direction, of the optical pickup 300.

The above embodiment states that the optical pickup 300 has the movable enclosure 301 that carries the objective-lens/hologram component 314, into which the objective lens 313 and the first reflecting surface 310 are formed integrally, and that the first reflecting surface 310 has the reflecting hologram region 308. However, the reflecting hologram region 308 may be alternatively formed on the second reflecting surface 311, and the objective-lens/hologram component 314 may be separate optical components. More specifically, a reflecting hologram optical component, the first reflecting surface, and the second reflecting surface, and the objective lens may each be a separate optical component, or at least two of these components may be formed integrally so as to reduce the number of optical components and thereby cut down a number of necessary steps for alignment process.

The above embodiment states that the first reflecting surface 310 is placed in parallel to the second reflecting surface 311 although this is not necessarily the case if the laser beam vertically enters into the objective lens 313. Also, the number of such reflecting surfaces is not limited to two, and may be one or more than two. However, it should be clear that by positioning the two reflecting surfaces 310 and 311 in parallel to one another, a constant distance can be kept between a principal ray of a laser beam incident on the first reflecting surface 310, and a principal ray of a laser beam reflected by the second reflecting surface 311 regardless of the position of the semiconductor laser 312. When the two reflecting surfaces 310 and 311 are parallel in this way, it becomes also possible to position the principal ray of the laser beam incident on the first reflecting surface 310 in parallel to the principal ray of the laser beam reflected by the second reflecting surface 311, so that only relatively low precision is required to assemble optical pickups.

In the above embodiment, the semiconductor laser 312 is integrated with the photodetector substrate 315 that contains the photodetectors 315a–315d for detecting the tracking and focusing errors in a hybrid manner. However, the semiconductor laser 312 may be formed on the photodetector substrate 315 in a monolithic manner, or the semiconductor laser 312 and the photodetector substrate 315 may be separately provided. It is also possible to form, on the photodetector substrate 315, a concave that contains a reflecting surface having a 45-degree gradient, and position in the concave a semiconductor laser of an end-face emission type, instead of the semiconductor laser 312.

The semiconductor laser 312 may be a semiconductor component with a uniform wavelength range, two or more semiconductor lasers that each have a different wavelength band, or a monolithic multi-wavelength semiconductor laser having emission points that correspond to at least two different wavelength ranges. When laser beams has more wavelength bands, the optical pickup 300 can perform a reproduction and a recording for more types of optical recording media by selecting a different wavelength suited to each recording medium type.

Further, the semiconductor laser 312 may be replaced with two or more semiconductor lasers that each have a different light output (light emission power), or a monolithic multi-wavelength semiconductor laser that has emission points corresponding to at least two different light outputs. When a high-powered semiconductor laser operates in low power for a reproduction of an optical recording medium, a high-frequency (HF) multiplexing processing is usually necessary so as to reduce noise of a return light. On the other hand, a low-powered semiconductor laser has a self-excited oscillation function, and therefore does not require such HF multiplexing processing during reproduction of an optical recording medium. Accordingly, when an optical pickup includes two semiconductor lasers having different light outputs so that the two semiconductor lasers are selectively used according to whether a recording or a reproduction is performed, both a recording and a reproduction can be performed without the HF multiplexing circuit being installed in the periphery of the optical pickup.

It is also possible to provide, on the photodetector substrate 315, an integrated circuit for performing operations relating to the focusing error detection signal and the tracking error detection signal. Such operations include a conversion, a calculation, and a selection of a current and a voltage for these signals. This can simplify a construction of an optical recorder/player that has the optical pickup since the above integrated circuit does not need to be placed outside the optical pickup.

Optical components such as the objective lens and the hologram optical component may be made of materials other than resins, such as glass instead. However, shaping can be more freely performed with resins than with glass, and therefore the use of resins makes it easier to shape fringes, for instance, that are used to bond and fix the components to the movable enclosure, and to combine one optical component with another.

Figure 31:
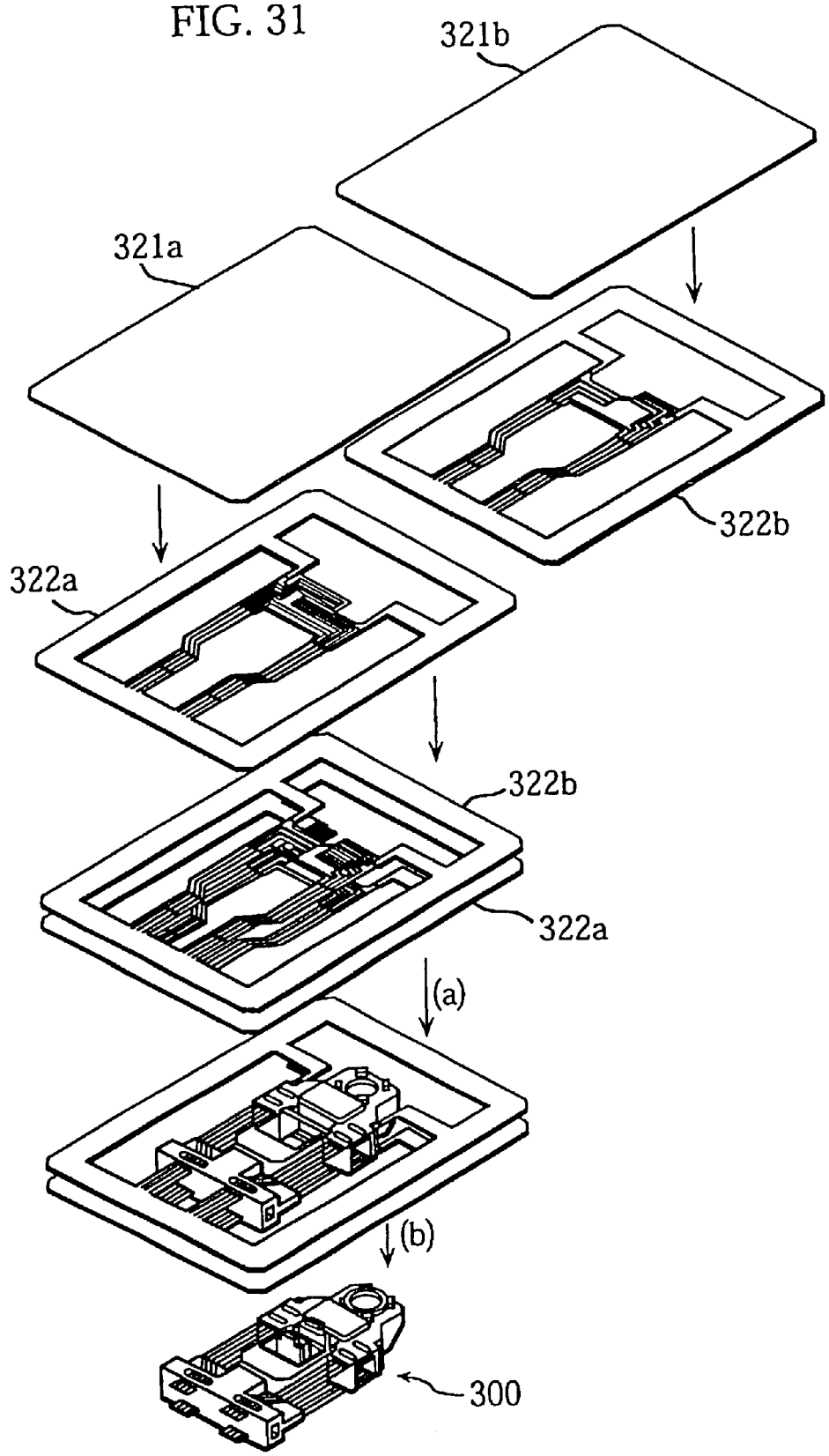
FIG. 31 shows a manufacturing process of the optical pickup of the eight embodiment.

The following describes a manufacturing method of the optical pickup 300 of the present embodiment. FIG. 31 shows the manufacturing process of the present optical pickup 300.

Two conductive plates 321a and 321b are used to form the elastic supporting members 303. For instance, the plates 321a and 321b are made of phosphor bronze, titanium copper, or beryllium copper. By performing etching or presswork for these plates 312a–312b to remove predetermined portions from the plates 312a–312b, an upper member 322b and a lower member 322a, which are to form the upper and lower elastic supporting members 303, can be obtained.

Portions closer to the end of the upper member 322b are bent on the side of the movable enclosure 301 using a bending mold (not shown in the figure) so as to make the surface of the bent portions has about the same height as a surface of the lower member 322a. This facilitates electrical wiring processes such as for bonding wires and bumps, and shortens the distance from terminal portions of the supporting members 303 to the semiconductor laser 306 & the photodetector substrate 315, so that the necessary length of the bonding wires can be reduced. It is alternatively possible to bend end portions of the lower member 322b or end portions of both the upper member 322b and the lower members 322a, or omit the bending process according to the layout and the state of the installment of the semiconductor laser 312 and the photodetector substrate 315.

Following this, the lower member 322a is horizontally placed on a bottom mold (not shown in the figure), and then side molds are applied from rightward and leftward with respect to a direction in which the elastic supporting members 303 extends. As a result, parts of the bottom mold and the side molds are in contact in a manner that the bottom mold holds up the lower member 322a and that the side molds press down the lower member 322a. After this, the upper member 322b is placed on the side molds, and then a top mold (not shown) covers the top. As a result, parts of the top mold and the side molds are in contact in a manner that the side molds hold up the upper member 322b and that the top mold presses down the upper member 322b.

After this, the insert molding process is performed using resins while the lower member 322a and the upper member 322b are firmly fixed by the above molds (in step (a) in FIG. 31) to form the movable enclosure 301 and the fixed member 302 in predetermined positions in a manner that they sandwich the elastic supporting members 303. Following this, the light emitting/receiving component substrate 306 is installed into the movable enclosure 301, and the second reflecting surface 311 is formed. The objective-lens/hologram component 314 is then fitted into the movable enclosure 301, and the driving coils 304 are installed. After this, the elastic supporting members 303 are electrically connected to electrical terminals inside the movable enclosure 301 using solder, bonding wires, or the like.

After this, unnecessary portions, such as frame-like portions, of the upper member 322b and the lower member 322a are removed to electrically separate each supporting member 303 (step (b) in the figure). As a result, the elastic supporting members 303 can be used as power-supplying lines for the semiconductor laser 312, the photodetector 315, and the driving coil 304, and as signal lines for detection signals from the photodetector 315.

Following this, viscoelastic materials (not shown in the figure) are filled into concaves 320 (see FIG. 27) in the fixed member 302 so as to suppress resonance. Lastly, the fixed member 302 is fixed onto the optical base (not shown), on which the yoke 317 supporting the magnets 305 is fixed.

Note that the process in step (b) to remove the unnecessary portions may be performed before the optical system is installed, or after the fixed member 302 has been fixed onto the optical base.

As described above, with the present manufacturing method for the optical pickup 300, the movable enclosure 301 and the fixed member 302 are molded together out of resins with the lower member 322a and the upper member 322b being fixed with the molds during the molding process. As a result, a process to connect the movable enclosure 301 and the fixed member 302 with the elastic supporting members 303 no longer needs to be independently performed, and distortions of the elastic supporting members 303 due to resin flows and shrinkages during a resin molding process can be reduced. In addition, with this manufacturing method, variations in properties of assembled optical pickups can be suppressed, and production efficiency is enhanced.

The above embodiments have been used to describe the optical pickup and the manufacturing method for this optical pickup of the present invention, although it should be clear that the present invention is not limited to these embodiments. For instance, the following modifications are possible.

(1) The optical pickup described in the eighth embodiment has a construction of the so-called "moving-coil type actuator", for which the driving coils 304 are positioned into the movable enclosure 301, and the magnets 306 are positioned onto the optical base. However, the present optical pickup may alternatively have a construction of the so-called "moving-magnet type actuator" for which driving coils are positioned onto the optical base and magnets are positioned into the movable enclosure 301.

(2) In the above embodiments, an objective lens, a semiconductor laser, and a photodetector are contained in a movable member, and each of the plurality of supporting members are electrically conductive. However, every supporting member does not have to be electrically conductive, and instead at least supporting members to be connected to the semiconductor laser may be electrically conductive. Especially for an optical pickup used only for recording, the photodetector does not have to be contained in the movable member, and therefore it is sufficient that at least two supporting members to be connected to the semiconductor laser are electrically conductive. Further, all the supporting members do not have to be electrically insulated from one another, and it is sufficient that only supporting members which function as lines to conduct power and/or a signal are insulated from one another.

(3) The sixth and seventh embodiments state that all the supporting members have layer constructions composed of a metal member and an insulating member. However, it is possible that only some of all the supporting members have a layer construction.

(4) The above embodiments state that base portions of all the supporting members are surrounded by a damping material on the side of the fixed member. However, resonance can be suppressed to some extent even when a base portion of at least one supporting member is surrounded by the damping material.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. An optical pickup, comprising:

a semiconductor laser for emitting a laser beam;

an objective lens for focusing the emitted laser beam on an optical recording medium;

a first member for carrying at least the semiconductor laser and the objective lens;

a second member; and a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member, wherein the plurality of supporting members include at least two supporting members that are electrically conductive, and wherein the at least two electrically conductive supporting members include electrically conductive supporting members that function as lines to conduct power to the semiconductor laser and have a larger surface area than other electrically conductive supporting members.

2. The optical pickup of claim 1, wherein the at least two electrically conductive supporting members are insulated from one another.

3. An optical pickup, comprising:

a semiconductor laser for emitting a laser beam;

an objective lens for focusing the emitted laser beam on an optical recording medium;

a first member for carrying at least the semiconductor laser and the objective lens;

a second member; and a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member, wherein the plurality of supporting members include at least two supporting members that are electrically conductive, wherein the at least two electrically conductive supporting members include electrically conductive supporting members that function as lines to conduct power to the semiconductor laser, wherein the second member contains a concave in which a base portion of at least one supporting member is present and wherein the concave is filled with a damping material that has viscoelasticity so that the base portion is surrounded by the damping material.

4. The optical pickup of claim 3, wherein the damping material is made of ultraviolet-hardening silicon gel.

5. An optical pickup, comprising:

a semiconductor laser for emitting a laser beam;

an objective lens for focusing the emitted laser beam on an optical recording medium;

a first member for carrying at least the semiconductor laser and the objective lens;

a second member; and a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member, wherein the plurality of supporting members include at least two supporting members that are electrically conductive, wherein the at least two electrically conductive supporting members include electrically conductive supporting members that function as lines to conduct power to the semiconductor laser, and wherein the plurality of supporting members include a first supporting member and a second supporting member that have different mechanical resonance frequencies.

6. The optical pickup of claim 5, wherein the first supporting member and the second supporting member are differently shaped.

7. The optical pickup of claim 5,
wherein the first supporting member and the second supporting member have different widths in a direction perpendicular to a longitudinal direction of the plurality of the supporting members.

8. The optical pickup of claim 5,
wherein the first supporting member and the second supporting member are made of different materials.

9. An optical pickup, comprising:
a semiconductor laser for emitting a laser beam;
an objective lens for focusing the emitted laser beam on an optical recording medium;
a first member for carrying at least the semiconductor laser and the objective lens;
a second member; and
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive,
wherein the at least two electrically conductive supporting members include electrically conductive supporting members that function as lines to conduct power to the semiconductor laser,
wherein the plurality of supporting members are divided into a plurality of groups,
wherein the second member has a plurality of concaves, in each of which base portions of supporting members of a same group are present, and
wherein the plurality of concaves are filled with at least two types of damping materials that have different viscoelasticity.

10. An optical pickup, comprising:
a semiconductor laser for emitting a laser beam;
an objective lens for focusing the emitted laser beam on an optical recording medium;
a first member for carrying at least the semiconductor laser and the objective lens;
a second member; and
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive,
wherein the at least two electrically conductive supporting members include electrically conductive supporting members that function as lines to conduct power to the semiconductor laser, and
wherein each of the at least two electrically conductive supporting members is made of one of phosphor bronze, beryllium copper, and titanium copper.

11. An optical pickup, comprising:
a semiconductor laser for emitting a laser beam;
an objective lens for focusing the emitted laser beam on an optical recording medium;
a first member for carrying at least the semiconductor laser and the objective lens;
a second member; and
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive,
wherein the at least two electrically conductive supporting members include electrically conductive supporting members that function as lines to conduct power to the semiconductor laser, and
wherein each of the plurality of supporting members is composed of a plurality of submembers.

12. The optical pickup of claim 11,
wherein each submember is a wire, and a plurality of wires in each supporting member are positioned closely together.

13. An optical pickup, comprising:
a semiconductor laser for emitting a laser beam;
an objective lens for focusing the emitted laser beam on an optical recording medium;
a first member for carrying at least the semiconductor laser and the objective lens;
a second member; and
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive,
wherein the at least two electrically conductive supporting members include electrically conductive supporting members that function as lines to conduct power to the semiconductor laser,
wherein each of the plurality of supporting members is composed of layers of at least two types of members.

14. The optical pickup of claim 13,
wherein the at least two types of members include a metal plate and an insulating plate and
wherein at least two metal plates and at least one insulating plate are alternatively layered to form each supporting member.

15. The optical pickup of claim 14,
wherein each insulating plate is made of a damping material that has viscoelasticity.

16. The optical pickup of claim 13,
wherein the at least two types of members are a metal member and an insulating member, and wherein the metal member and the insulating member are cylindrical, and at least two metal members and at least one insulating member are alternatively and coaxially layered to form each supporting member.

17. The optical pickup of claim 13,
wherein the plurality of supporting members include at least two types of supporting members that have different cross-sectional shapes.

18. The optical pickup of claim 13,
wherein the plurality of supporting members include at least two types of supporting members that have cross sections of different sizes.

19. An optical pickup, comprising:
a semiconductor laser for emitting a laser beam;
an objective lens for focusing the emitted laser beam on an optical recording medium;
a first member for carrying at least the semiconductor laser and the objective lens;
a second member; and
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive,
wherein the at least two electrically conductive supporting members include electrically conductive supporting members that function as lines to conduct power to the semiconductor laser,
wherein at least one of the first member and the second member is connected to each of the at least two electrically conductive supporting members by solder joints, and
wherein an amount of each solder joint is adjusted so that each electrically conductive supporting member has a same supporting length, the supporting length being between the first portion and the second portion.

20. An optical pickup, comprising:
a semiconductor laser for emitting a laser beam;
an objective lens for focusing the emitted laser beam on an optical recording medium;
a first member for carrying at least the semiconductor laser and the objective lens;
a second member; and
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive,
wherein the at least two electrically conductive supporting members include electrically conductive supporting members that function as lines to conduct power to the semiconductor laser, and
wherein the first portion of each supporting member is embedded into the first member to connect the supporting member with the first member.

21. An optical pickup comprising:
a semiconductor laser for emitting a laser beam;
an objective lens for focusing the emitted laser beam on an optical recording medium;
a first member for carrying at least the semiconductor laser and the objective lens;
a second member;
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive, and
wherein the at least two electrically conductive supporting members include electrically conductive supporting members that function as lines to conduct power to the semiconductor laser; and
driving means that has two driving coils that generate a driving force to move the objective lens in a focusing direction and a tracking direction,
wherein the two driving coils are positioned in the first member in an approximately central portion in a direction perpendicular to: (a) a direction of an optical axis of the objective lens; and (b) a longitudinal direction of the supporting members.

22. The optical pickup of claim 21,
wherein out of the plurality of supporting members, at least six supporting members are electrically conductive,
wherein the plurality of supporting members are positioned symmetrically with respect to a position at which the driving coils are positioned, with a number of supporting members on each side of the position being the same, and
wherein on each side of the position, at least two of the at least six electrically conductive supporting members are positioned closer to the driving coils than other supporting members.

23. An optical pickup, comprising:
a semiconductor laser for emitting a laser beam;
an objective lens for focusing the emitted laser beam on an optical recording medium;
a first member for carrying at least the semiconductor laser and the objective lens;
a second member; and
a plurality of supporting members that are elastic and each contain a first portion and a second portion which are respectively connected to the first member and the second member, wherein the second member supports the first member via the plurality of supporting members in a manner that allows the first member to move in predetermined directions with respect to the second member,
wherein the plurality of supporting members include at least two supporting members that are electrically conductive, wherein the at least two electrically conductive supporting members include electrically conductive supporting members that function as lines to conduct power to the semiconductor laser, wherein the first member further contains:

a first reflecting means that has a first surface which reflects a laser beam emitted by the semiconductor laser; and a second reflecting means that has a second surface which reflects the laser beam, which has been reflected by the first surface, toward the objective lens, and wherein the first surface and the second surface are parallel.

24. The optical pickup of claim 23, wherein the first member further contains a photodetector, which is positioned apart from the semiconductor laser and wherein the first surface has a reflecting hologram region, wherein the second surface also reflects a return beam which has been reflected by the recording medium, and wherein the reflecting hologram region receives the return beam reflected by the second surface, and diffracts the received return beam to have the photodetector receive the diffracted return beam.

25. An optical pickup, comprising:

a semiconductor laser for emitting a laser beam;

an objective lens for focusing the emitted laser beam on an optical recording medium;

a first member for carrying at least the semiconductor laser and the objective lens;

a second member; and a plurality of supporting members that each contain a first portion and a second portion which are respectively connected to the first member and the second member, wherein the second member supports the first member via the plurality of supporting members in a manner that allows the first member to move in predetermined directions with respect to the second member, the plurality of supporting members are positioned at predetermined intervals and have a substantially uniform stress distributed to each of the plurality of supporting members.

26. The optical pickup of claim 25, wherein the plurality of supporting members include at least two supporting members that are electrically conductive, and wherein at least two electrically conductive supporting members include electrically conductive supporting members that function as lines to conduct power to the semiconductor laser.

27. The optical pickup of claim 25, wherein the supporting members that function as the lines to conduct power have a larger surface area than other electrically conductive members.

28. The optical pickup of claim 25, wherein a number of the plurality of supporting members are at least six, and wherein the plurality of supporting members are substantially parallel in a longitudinal direction of the plurality of supporting members.

29. The optical pickup of claim 25, wherein the plurality of supporting members include a first supporting member and a second supporting member that have different mechanical resonance frequencies.

30. The optical pickup of claim 25, wherein each of the plurality of supporting members are composed of a plurality of submembers.

31. The optical pickup of claim 30, wherein each submember is a wire, and a plurality of wires in each supporting member is positioned closely together.

* * * * *